(12) United States Patent
Schneider et al.

(10) Patent No.: US 7,767,065 B2
(45) Date of Patent: Aug. 3, 2010

(54) DEVICE AND METHOD FOR ELECTROLYTICALLY TREATING AN AT LEAST SUPERFICIALLY ELECTRICALLY CONDUCTING WORK PIECE

(75) Inventors: Reinhard Schneider, Berlin (DE); Stephan Kenny, Berlin (DE); Torsten Küssner, Berlin (DE); Wolfgang Plöse, Neuruppin (DE); Bert Reents, Berlin (DE); Heribert Streup, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 1189 days.

(21) Appl. No.: 10/526,149

(22) PCT Filed: Aug. 28, 2003

(86) PCT No.: PCT/EP03/09526

§ 371 (c)(1),
(2), (4) Date: May 16, 2005

(87) PCT Pub. No.: WO2004/022814

PCT Pub. Date: Mar. 18, 2004

(65) Prior Publication Data

US 2006/0076241 A1    Apr. 13, 2006

(30) Foreign Application Priority Data

Sep. 4, 2002    (DE) ............................... 102 41 619

(51) Int. Cl.
C25D 17/06    (2006.01)
C25D 17/02    (2006.01)
C25D 17/08    (2006.01)
C25D 21/10    (2006.01)

(52) U.S. Cl. .................. 204/224 R; 204/198; 204/202; 204/275.1; 204/278.5; 204/297.01; 204/297.08; 118/500; 118/503; 118/416; 118/423; 118/428; 118/305

(58) Field of Classification Search ................. 204/198, 204/202, 224 R, 275.1, 278.5, 297.01, 297.08; 118/500, 503, 416, 423, 426, 428, 305
See application file for complete search history.

(56) References Cited

U.S. PATENT DOCUMENTS 4,752,371 A    6/1988 Kreisel et al.
4,776,939 A *  10/1988 Blasing et al. .............. 204/202

(Continued)

FOREIGN PATENT DOCUMENTS

DE    36 24 481 A1    1/1988

(Continued)

*Primary Examiner*—Bruce F Bell
(74) *Attorney, Agent, or Firm*—Frank J. Bonini, Jr.; John F. A. Earley, III; Harding, Earley, Follmer & Frailey, P.C.

(57) ABSTRACT

A problem during electrolytic treatment of printed circuit boards having a very thin basic metallization is that the treatment yields irregular results in various regions on the surface of the printed circuit board. In overcoming this problem the invention provides a device for electrolytically treating an at least superficially electrically conducting work piece having at least two substantially opposing side edges. The device comprises current supply devices for the work piece, said current supply devices each comprising contact strips located on the opposing side edges which are capable of electrically contacting the work piece at the substantially opposing side edges.

31 Claims, 10 Drawing Sheets

U.S. PATENT DOCUMENTS

| | | | |
|---|---|---|---|
| 4,898,657 A * | 2/1990 | Hosten | 204/198 |
| 6,186,316 B1 | 2/2001 | Deinis | |
| 6,238,529 B1 * | 5/2001 | Geissler et al. | 204/202 |
| 6,299,745 B1 * | 10/2001 | Kumar et al. | 204/297.01 |
| 7,534,329 B2 * | 5/2009 | Van Gent | 204/297.09 |

FOREIGN PATENT DOCUMENTS

| | | |
|---|---|---|
| DE | 36 45 319 C2 | 1/1988 |
| DE | 41 32 418 C1 | 2/1993 |
| DE | 42 43 252 A1 | 7/1993 |
| DE | 100 43 815 A1 | 4/2002 |
| DE | 100 43 817 A1 | 4/2002 |
| EP | 1 384 798 A | 1/2004 |
| JP | 59 220993 A | 12/1984 |
| JP | 62 222081 A | 9/1987 |
| JP | A-H04-246200 A | 9/1992 |
| JP | A-H05-320994 | 12/1993 |
| JP | 2000 199099 A | 7/2000 |
| NL | 1021165 * | 7/2002 |

* cited by examiner

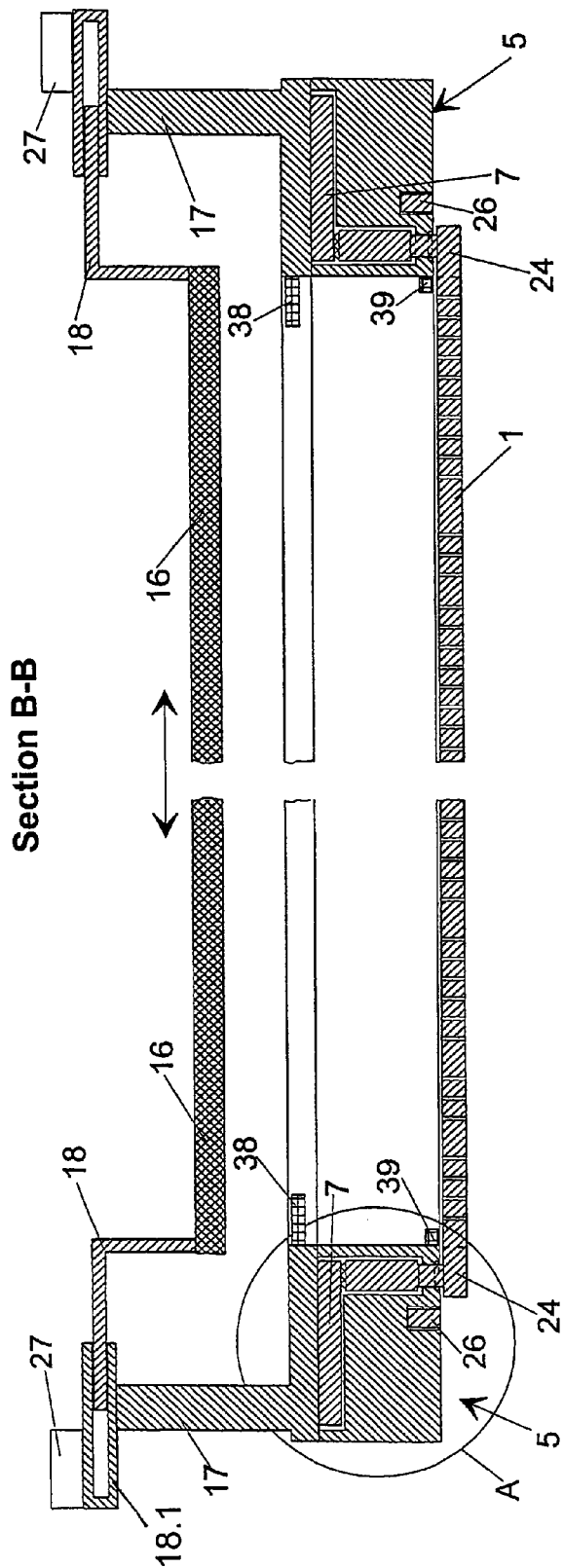
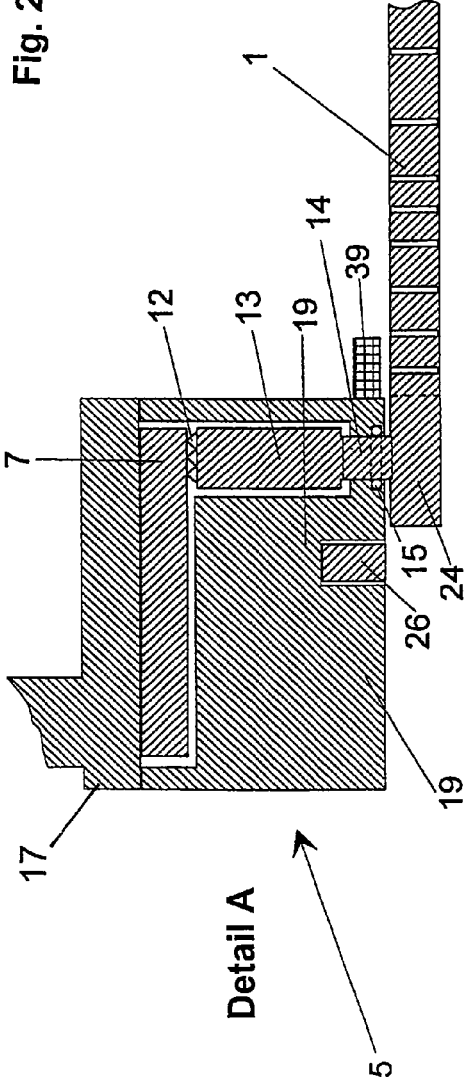

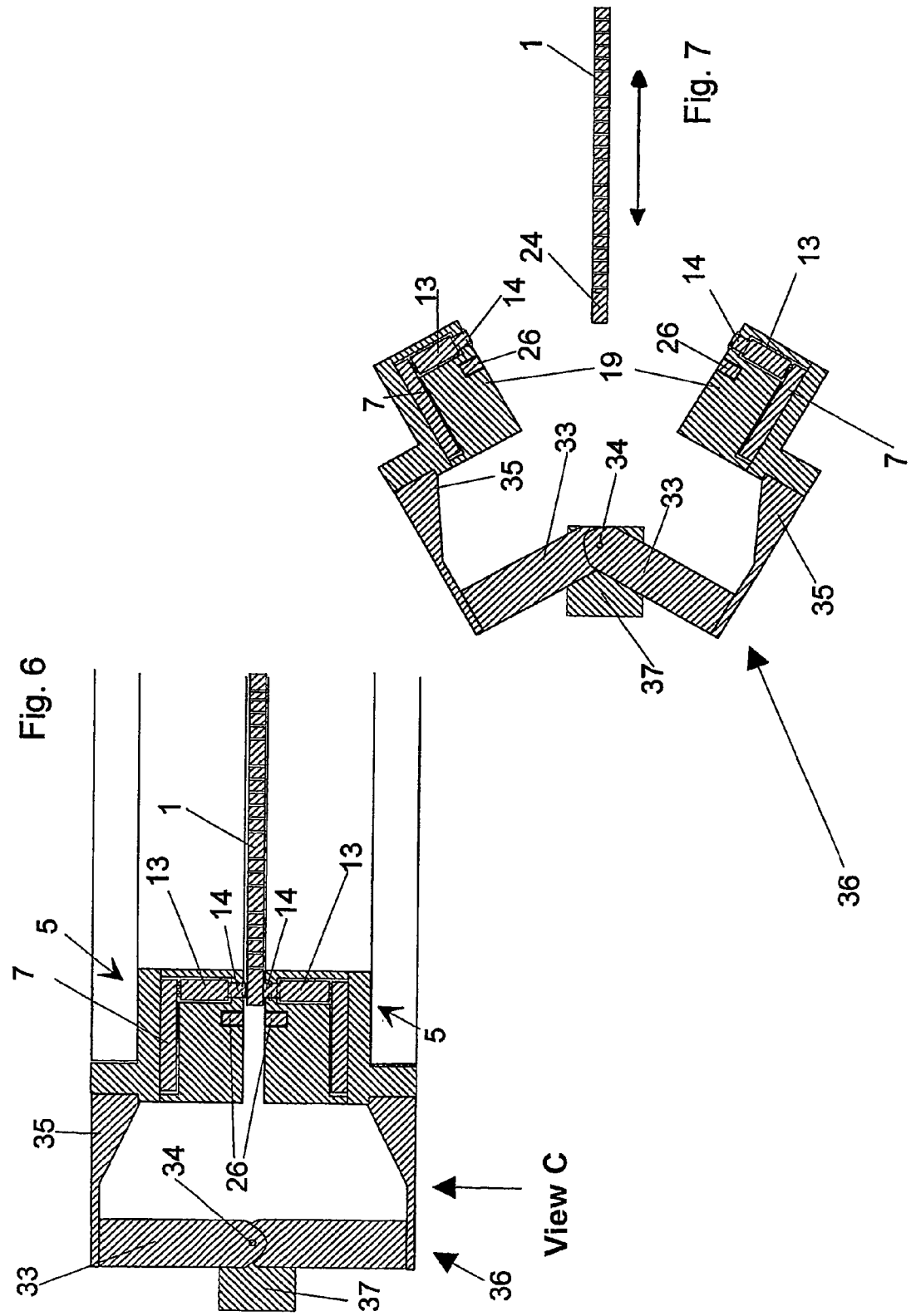

DEVICE AND METHOD FOR ELECTROLYTICALLY TREATING AN AT LEAST SUPERFICIALLY ELECTRICALLY CONDUCTING WORK PIECE

The invention relates to a device and to a method for electrolytically treating an at least superficially electrically conducting work piece. Electrolytic treatment comprises above all the process of electrolytically metal plating and etching thin electrically conducting layers on printed circuit board material. The invention is more specifically suited for use in horizontal and vertical plating lines.

The increasingly smaller structures in the printed circuit and SmardCard technique require ever thinner base layers to be processed. Formerly, said base layers were obtained by what is termed copper cladding which consisted in adhesively coupling a very thin electrolytic copper foil of 15-35 μm thick to the electrically non-conducting substrate made of a plastic material. In fine line printed circuit boards, these base layers are nowadays generally obtained by electroless (chemical) metal deposition. Such a base layer is through-plated for example and a fine line patterning with 50 μm lines and spaces is electrolytically deposited thereon. In order to complete the printed circuit board, a reinforced base layer must be removed by chemical etching from between the electrolytically metal plated circuit traces. In order for the circuit traces not to be undercut during this etching step, the base layer must be thin. In the fine line printed circuit technique, the base layers used are 2-5 μm thick. In SBU (sequential build up) applications, the base layers utilized are for example made of electroless deposited copper of but 0.3-1.0 μm thick.

The deposition of thin metal layers, more specifically copper layers, onto the printed circuit board base material, is compatible with current printed circuit board processing lines. Such lines are described in U.S. Pat. No. 4,776,939 and in DE 41 32 418 C1 for example. Both documents show lines in which the printed circuit board material is conveyorized through the line in a horizontal direction of transport. In both cases, the material is conducted in a horizontal plane of transport. U.S. Pat. No. 4,776,939 describes a conveyorized line for printed circuit boards that has laterally arranged clamps for placing the work pieces in electrical contact. DE 41 32 418 C1 discloses a conveyorized line having contacting wheels for laterally placing the printed circuit boards in contact.

It has been found out that, with metal plating being performed at a relatively high current density of for example 10 A/dm$^2$, it is no longer readily possible to electrolytically metal plate printed circuit board material with a very thin base layer of for example 5 μm thick. In this event, it may happen that less or no metal at all be deposited onto regions that are located at a relatively great distance, e.g., 50 cm, from the electrical contacting sites. Electric current is supplied through the electrical contacting sites to the base layer (basic metallization) by means of the clamps according to U.S. Pat. No. 4,776,939 or of the contacting rolls according to DE 41 32 418 C1.

The above mentioned problem can be mitigated by reducing the current density for example. This solution however suffers from the disadvantage that the efficiency and the rentability of the electrolytic metal plating line are reduced as a result thereof. For, under these circumstances and in order to deposit a metal layer with a given layer thickness, the processing lines must be of a sufficient length to hold the printed circuit board material for the time necessary for metal plating. This involves expenses for investment and incidentals as well as for manpower, upkeep, maintenance and repair that make such a line uneconomical to operate.

Using a lower cathodic current density, another disadvantage has been found out, which is that a thin base layer of copper that is to be metal plated dissolves in part or in whole in the usually used sulphuric acid copper bath utilized for electrolytic metallization, so that only the electrically non-conducting base material remains.

Further, to minimize scrap, the printed circuit board industry has been interested for a long time in being capable of recognizing in-time, during each electroplating procedure and for every printed circuit board, possible thickness differences using measurements such as charge measurement (in ampere-hours).

One reason for differences in the coating thickness may for example be faults in establishing electrical contact due to damaged or contaminated electrical contacts or to a damaged feed cable.

Such type differences may also be due to changes in the electric conductivity of the electrolyte fluid as a result of the bath having been altered in composition, for example with one substance being overdosed on one site of the bath (in the event of a failure of the mixing device for example), or of different temperatures prevailing within the bath. These problems in performing the method not only affect the coating thickness but also lead to a varying quality of the layer deposited on the printed circuit board.

DE 100 43 815 A1 describes a method and a device for placing a work piece to be processed in electrical contact in electrolytic lines. The device more specifically serves to treat electrical printed circuit boards. It consists of a conveying system, a pumping system for circulating the electrolytic bath and facilities for regenerating the electrolyte, a plating current source for supplying the electrolytic cell, electric elements for transmitting the current from the plating current source to the work piece and strip contacts that are disposed transversely to the direction of transport of the work piece with their contacting side turned toward the surface of the work piece that is to be treated, further of lifting facilities for the strip contacts for continuous, almost vertical approach, position of rest with electrochemical treatment of the work piece and removal of the strip contacts from the surface of the work piece, further of a conveying system for conveying the work piece through the electrolytic cell in such a manner that the strip contacts and the work piece are prevented from moving relative to one another during electrolytic treatment and finally of a switching equipment for coordinated switching of the lifting facilities for the strip contacts and the conveying systems for the work piece. In accordance with the invention, the device is utilized as follows: the work piece is conveyed into the electrolytic bath where it is contacted with the electrolyte. The electrically conducting surfaces are placed in electric contact and are conductively connected to the plating current source. For electric contact, the strip contacts are placed onto the surface of the work piece against which they are pressed. The work piece is conveyed through the electrolytic cell formed by the electrodes and the work piece in such a manner that, from the moment the strip contacts have been positioned at the latest, said strip contacts and the work piece are prevented from moving relative to one another. The work piece is electrochemically treated while the strip contacts are placed on the surface thereof. After the processing step is completed, the strip contacts are lifted from the surface of the work piece. As the strip contacts are being lifted, the work piece is moved relative to the strip contacts and the electrodes of the electrolytic cell, this motion being due to transport. This sequence, from electrolytically contacting the surfaces with the strip contacts to the last mentioned method step, is continuously repeated.

DE 100 43 817 A1 suggests a method and an arrangement for a work piece, more specifically a printed circuit board, that is to be treated electrochemically. The arrangement comprises a working tank for holding the electrolyte and the work piece, a fluid delivery facility for the electrolyte for circulating the electrolyte through the working tank, electrolyte filters and electrolyte conditioning tanks, an equipment for conveying the work piece out of the working tank, a contact electrode in the working tank that consists of an electric contact strip and of a counter electrode disposed in immediate proximity thereto, an electrically insulating means that is disposed between each contact strip and each counter electrode for forming small electrolytic cells, a plating current source and the associated electric conductors for supplying current to the small electrolytic cells. In accordance with the invention, the arrangement further comprises a contact electrode which conforms to the shape of the work piece, a conveying member in the working tank that is designed and controlled in such a manner that, as long as the contact electrode is resting on the surface of the work piece, the contact electrode and the surface of the work piece are prevented from moving relative to one another due to transport, a control facility for synchronizing the advancing of the work piece or of the contact electrode in the working tank with the opening and closing movements of the contact electrode as well as a moving member for cyclically performing the following method steps: causing the contact electrode and the work piece to get nearer to each other, placing the contact strips onto the surface of the work piece, allowing the contact strips to rest on the surface for electrolytic treatment, lifting the contact strips from the surface and mutually removing the contact electrode and the work piece and repositioning the work piece relative to the contact electrode.

The object of the present invention now is to find a solution permitting to avoid the drawbacks of the known devices and methods. The device and the method to be found are more specifically intended to make it possible to assess the quality of metal deposits during the manufacturing of printed circuit boards and to remedy quality related problems upon detection thereof. Economical operation is further to be achieved by which a metal coating can be deposited with uniform thickness onto large-format work pieces, more specifically onto electrical printed circuit boards and other circuit carriers, without an existing thin basic metallization interfering therewith. The device and the method in accordance with the invention are also intended to allow for other electrolytic treatments that are also to be uniform on large-format work pieces such as an electrolytic etching process for example. The sensitive useful zone of the printed circuit boards is not allowed to come into contact with the contacts. This object is achieved by the device described in claim 1 and by the method described in claim 26. Special implementations of the invention are described in the subordinate claims.

The superficially electrically conducting work piece referred to hereinafter is to be construed as either any work piece that is made in its entirety of electrically conducting material, for example of a metallic material, or as any work piece that is electrically conducting on its surface only, for example by providing it with a metallic surface layer.

By electrical printed circuit boards circuit carriers are meant which are made from a board-shaped laminate that may be built up in a plurality of dielectric and metallic layers and may comprise vias (through-hole vias, buried vias and blind vias). The term may also be construed, i.a., as any structure that does not have the shape of a board and serves to electrically connect electric components which are attached and placed into electric contact on these circuit carriers. They may for example refer to three-dimensional structures which carry circuit trace structures. Moreover, by electrical printed circuit boards, other circuit carriers are also meant such as for example chip carriers including hybride systems. In principle, the term work piece is not to be construed as an electrical printed circuit board only, but as any product serving other purposes as well.

When hereinafter the work piece is said to be disposed opposite the counter electrodes, it is meant that the counter electrodes and the work piece are held a determined distance apart from each other, preferably in parallel planes in which are located the counter electrodes and the work piece if said counter electrodes and said work piece are shaped like a board. In other cases, in which the counter electrodes and the work piece have a complex three-dimensional structure, an arrangement is to be construed in which the counter electrodes and the work piece are held a pre-determined distance apart, certain surfaces of the counter electrodes and of the work piece being turned toward each other and being held a mean distance apart from each other.

When hereinafter two substantially opposing side edges are said to be provided, it is meant that the side edges are held apart to the greatest possible distance. As viewed from the one side edge, the other side edge is located on the other side of an imaginary centre of gravity of the work piece. In the case of substantially opposing side edges of board-shaped rectangular work pieces for example, the side edges are parallel. In this case, there are two pairs of opposing side edges.

The term contact strips is to be construed herein after as any electric contacting element intended to supply current to the work piece that comprises elongated contact areas for transmitting the current to the work piece or that comprises a plurality of small single contacts which are closely spaced, for example less than 1 cm apart, and are embedded in elongated current supply devices. The very single contacts can also be configured to be elongated, preferably being disposed in a row, and can be carried by springs for enhanced fit on the metal surfaces. As a result, the contact strips have a length/width ratio of the electric contact area that is substantially greater than 1. This ratio may for example be at least 5, preferably at least 10 and most preferably at least 20. The upper limit of this ratio is given by the length of the side edges and a minimum width of the contact areas, which in turn is determined by the suitability of the contact area for transmitting to the work piece the greatest possible current.

When current supply devices, contact strips, supporting frames, supporting frame legs, contacting frames, supporting points in a treatment tank, supporting elements, counter electrodes, frame covers, processing fluid feed and drain lines in frame covers, treatment tanks, entry and exit areas, conveying devices, current supplies and processing stations are referred to herein after, these terms are each to be construed as one or several of these elements.

The invention serves for electrolytically treating an at least superficially conducting work piece, more specifically an electrical printed circuit board. By electrolytic treatment of the electrical printed circuit boards it is meant that they may be electrolytically metal plated or electrolytically etched or electrolytically treated in any other way (for example by electrolytic oxidation or reduction). The invention is more specifically related to manufacturing electrical printed circuit boards that are treated either in dip tanks in which the electrical printed circuit boards are immersed in the processing fluid in a substantially vertical orientation for electrolytic treatment or in what are termed conveyorized lines in which the electrical printed circuit boards are conveyed in a horizontal direction of transport and are contacted with the processing fluid and treated electrolytically in the process. In the latter case, the electrical printed circuit boards may be held and conveyed in a horizontal or vertical orientation. In a preferred application of the present invention, electrical printed circuit boards are manufactured starting from an electrically non-conducting material the outer faces of which are at first provided with a very thin basic metallization only. Said very thin basic metallization is reinforced in accordance with the invention by means of electrolytic deposition.

The device according to the invention comprises current supply devices for the work piece. The current supply devices in turn each comprise contact strips provided on the substantially opposing side edges of the work piece. Therefore at least two contact strips may be provided at the opposing side edges. The work piece is placed in electric contact with a current source through said current supply devices.

The customary, relatively insecure current transfer from the direct current source via cables to a flight bar reception, from there to movable flight bars, and then through racks or clamps to the work piece in vertical electroplating lines is substantially simplified as a result thereof.

As contrasted with the present invention, the electrolytic treatment of very thin base layers on an electrically insulating material is not satisfactory using the known devices and methods:

Thin base layers, for example 0.3 µm thick electroless deposited copper layers, have relatively high electrical resistance. Said resistance is up to 100 times higher than that of the hereto before customary 17.5 µm thick base layers made from electrolyte copper. Said difference is i.a. due to the fact that the resistance of electroless deposited copper layers is higher than that of electrolytically deposited copper.

The current in an electrolytic cell is distributed through the base layer and is run to the contacting means that electrically connects the work piece, a printed circuit board for example, to the plating current source.

If the contacting means of an electrolytic metal plating line contact a board-shaped work piece at one edge only, the entire current must flow to the opposing edge through the thin base layer. At the beginning of an electrolytic treatment, when the base layer is still thin, said current causes the voltage to drop considerably in the base layer. Due to the metal plating said voltage drop reduces the cell voltage at various sites on the surface of the work piece relative to a counter electrode to different extents. During electrolytic metal plating, the base layer thickens with increasing treatment time, with the electric conductivity increasing as a result thereof. During electrolytic etching, the electric conductivity is reduced accordingly. As a result, the electrolytic treatment of the surfaces is non-uniform in both cases, which is undesirable. Using conventional plating lines due to the differing thickness in base metallization the electrolytic treatment varies from one product to the other. However, in conveyorized plating lines usually provided with a plurality of anodes, it is required to treat various different types of work pieces the base layers of which have very different thicknesses in a thickness ratio range of up to 1:100 without differences in quality.

The problem described could be overcome in using for example one of the devices according to DE 100 43 815 A1 and DE 100 43 817 A1, since the spacing between the contacting sites can be minimized. However, this approach suffers from the disadvantage that during treatment no electrolytic treatment is allowed to take place beneath the contact strip because the antipole (anode or cathode respectively) is completely shielded. This results in non-uniform electrolytic treatment. This disadvantage is intended to be avoided by conveying the work pieces in cycles in many small stages and by delaying the positioning of the contact strips on ever different sites of a printed circuit board relative to the advance of the work. However, this method suffers from the disadvantage that the frequent repositioning of the contact strips without applying electric current is very time-consuming with the printed circuit boards not being electrolytically metal plated during this period of time. As a result, the line must be lengthened, which involves higher manufacturing costs. Moreover, the contacts are always pressed against the useful area of the printed circuit boards. For example undesired metal deposits, dirt particles or chips on the contacts may get pressed into the initially still thin and therefore sensitive base layer, resulting in scrap. Furthermore, these approaches do not allow measurements that permit to detect possible coating thickness differences to be carried out individually for every single printed circuit board.

By contrast, it has been found out that the device in accordance with the invention, which is provided with contact strips for placing the work piece in electric contact, said contact strips contacting the work piece on opposing side edges thereof for establishing an electric contact there, is perfectly suited to solve the problems that arise using the known devices and performing the known methods, more specifically if, while contacting work pieces with a preferably rectangular shape, the contact strips extend over substantially the entire length or at least over a substantial portion of said length, for example over at least 75% of the length of the side edges:

Uniform electrolytic treatment is achieved in placing the opposing side edges of a work piece in electric contact with a very thin metallic base layer. Under these conditions, a voltage drop due to increased electrical resistance of the base layer has not the same negative effect than with customarily contacted work pieces.

Moreover, in this way of contacting the work, there is much less electrical transition resistance. The direct current source and the work piece can be connected through a continuous cable leading from the connection terminals on the rectifiers to the contacting frame. From there electric current is directly conducted to the site contacting the work piece. Relying on moving flight bars for transmitting the current to the work piece results in substantially more insecure sites with transition resistance.

In a preferred embodiment of the invention, the contact strips are implemented in such a manner that they are capable of holding the work piece. A preferred structural design is thus achieved: Since the contact strips are capable of holding the work piece, no further holding means are required. As the contact strips serve to transmit electric current to the work pieces, they must be pressed firmly against the surface of the work piece in order to establish good electrical contact permitting to supply even high currents. Since a relatively great force is needed therefore, it is advantageous to concurrently use this force to hold the work piece.

To effectively realize the functions of the contact strips of establishing electrical contact and of holding the work pieces, at least two respective contact strips are joined together in one contacting frame in a preferred development of the invention. In another embodiment, two such contacting frames are linked together, especially pivoted to one another, preferably in a longitudinal axis, and more specifically for closing, so that the work piece can be removably clamped between the contacting frames. Contact strips, forming three respective sides of a rectangle and being pivoted together via respective longitudinal axis at their longitudinal edges, may for example form a three-sided frame for the work piece, with the contact strips disposed on one side of the work piece being either joined together or connected to the treatment tank through holding members and the contact strips located on the other side of the work piece being connected to the other contact strips through the longitudinal axes only. A fourth pair of contact strips can be provided on the fourth side of the rectangle with the one of this pair of contact strips being connected to the other contact strips on the same side of the work piece or to the treatment tank through holding members. The other one of this pair is linked to the first one of this pair. To permit introduction of the work piece from the top into the vertically standing arrangement of contact strips, the hinge-linked fourth contact strip must be able to be deflected at least 180 degrees relative to the plane in which the work piece is being held. If level work pieces are lowered from the top into a treatment tank, the pivotable contact strips are opened. After the work piece has been lowered, said contact strips are folded against the work piece which they clampingly hold between them. The contacting frames can be attached to supporting frames. As a result, the work piece can be taken hold of by contacting frames and be concurrently fed with electric current for electrolytic treatment. Manipulation of the work piece is thus substantially facilitated.

A major advantage of the present invention is that it permits to quantitatively determine, during the electrolytic treatment already, whether the treatment is conducted in compliance with the given standards. Quality parameters are defined for this purpose and are determined individually for each work piece. Such individual measurement at each work piece is possible since the work pieces are is electrical contact with the contact strips and since a work piece has no direct electrical connection to neighbouring work pieces, as for example through the electrically conducting flight bar. Therefore appropriate process parameters can be controlled by the selective online measurement of current, voltage, charge (ampere-hours) and potentials much more accurately than with the known devices. Further, for example the flow rate of processing fluid on certain sites of the work piece and the brightness of the metal deposited can be determined individually for every single work piece.

The quantity of the metal deposited during the electrolytic metallization of printed circuit boards can be measured for each printed circuit board individually for example. For this purpose, measuring probes in particular can be disposed at a site located proximate the surface of (opposite) the printed circuit board. These measuring probes permit to measure for example the electrical resistance between the surface of the printed circuit board and the measuring probe both before the electrolysis current is switched on and after it has been switched off in order to determine the coating thickness of the metal. A counter electrode (an anode in metal plating) can be employed as a measuring probe if it is spatially associated with the printed circuit board. The electrical resistance may also be measured between discrete contact strips, for example between two opposing contact strips, and be used for determining the coating thickness of the metal. The electrical resistance being measured between the contact strips can also be determined before contacting the printed circuit board with the processing fluid.

Deviations from reference values can be determined quickly by measuring the electrical resistances and an alarm may be triggered for example. For this purpose, reference values are taken as a basis for every single type of printed circuit board and the differences between the actually measured values and the respective reference values are determined for each printed circuit board.

The amount of metal deposited can be determined with even more accuracy with the help of the known surface of one single printed circuit board that comes into effect in the electrolytic treatment and of a current (charge) measurement during the electrolysis treatment (ampere-hour metering of the consumed current). For this purpose, the current that flows to every single printed circuit board is measured separately and possibly integrated on the electrolysis time (determined quantity of charge which is proportional to the deposited or dissolved amount of metal, respectively). Furthermore, the current flowing to a counter electrode (during metallization of an anode) can also be determined individually. The current or the amount of current integrated on time will suffice to determine whether the counter electrode and the contacting process operate without failure. Passive areas, which prevent electrolytic reactions from taking place, could for example have formed on the counter electrode. This would be immediately detected by the current or charge measurement. If the counter electrode would not be associated to an individual printed circuit board with regard to space and current supply as in the case of a conventional arrangement of printed circuit boards in a plating tank, this measurement is but insufficiently indicative of the efficiency of the counter electrode. If, by contrast, the counter electrode is also associated with regard to space and current supply to this individual printed circuit board, such type measurements are directly indicative of the actual electrolysis conditions for this printed circuit board.

An alarm can be triggered in the event the electrolysis current for example deviates from the reference value and manual or automatic provisions can be made for compensating for possible failure during electrolytic treatment. The metal deposition time can be extended or the current density increased for example. In vertical conveyorized plating lines, conveyor carriages for moving printed circuit boards from one processing station to the other are used. As these carriages are freely movable above the path of travel of the printed circuit boards and are equipped with grabbers for every single printed circuit board, additionally provided treatment devices may be approached by the printed circuit boards to be repaired in the event deviations from the reference value of for example the coating thickness on individual printed circuit boards are measured in order to compensate for deviations detected by control measurements. If, due to damage, an increased transition resistance is for example noticed on a certain contact strip contacting a printed circuit board, the printed circuit board of concern can be subjected to a post-treatment in a special processing station in which every single one of the contact strips can be supplied with individual current and voltage values. Accordingly, in this case, the printed circuit board is supplied with current through only that contact strip at which failure occurred.

Other physical parameters of the work piece can further be determined for each individual piece. The brightness of the metal deposited may for example be measured. If deviations from a reference value are detected, a printed circuit board is for example subsequently treated in another bath having a special electrolyte composition. If the printed circuit board is treated in a vertical conveyorized line, the printed circuit board can be transferred automatically, through a suited control system for the transportation thereof, to a repair station where the fault is repaired. A special control programme for repairing the fault may be run for the purpose. Such a programme may for example also include that excess metal deposited onto the printed circuit board is removed again by reversing the polarity of the plating current at the printed circuit board of concern. Further, metal can be removed from a printed circuit board by shielding a supporting frame carrying the contact strips while another printed circuit board is being metal plated concurrently.

All of the aforementioned measurements can be acquired and recorded using a connected computer system. Faults may thus be inferred there from at a later stage as well, permitting selective correcting measures to be taken.

The contact strips may more specifically be fastened to supporting frames. This permits the device to be simple in construction if the contact strips are not joined together to form a contacting frame.

In a preferred embodiment of the invention, the supporting frames have substantially the same size as the work pieces. Moreover, the supporting frames may also have substantially the same shape as the work pieces. With the supporting frames being configured to have such a shape and size, they are capable of grasping the work pieces, for example electrical printed circuit boards, individually and of holding them during electrolytic treatment. Accordingly, the supporting frames may for example have four supporting frame legs which are oriented substantially parallel to the side edges of the work piece if the work piece is board-shaped and rectangular, the supporting frame legs being attached to the contact strips. With this implementation and arrangement of the supporting frames and contact strips, for electrolytic treatment electric current may be fed to the work piece, more specifically a printed circuit board, via the contact strips. As the supporting frames and the contact strips are substantially conformed to the shape and size of the work piece, automated manipulation of the work piece is possible. As a result, the work piece can be placed in electric contact with the current source and mechanically retained in a simple and reliable manner with the advantages in accordance with the invention, i.e., non-problematic current supply with even very thin metallic base layers, being achieved. Further, the useful area remains untouched during treatment as opposed to the devices and methods disclosed in DE 100 43 815 A1 and DE 100 43 817 A1.

Further, alternatively or additionally, at least two contact strips may be joined together in one contacting frame and two contacting frames and/or supporting frames can be linked together through a respective one of the contact strips, preferably pivoted through an axle/hinge, so that the rectangular board may be removably clamped between the frames.

A simplified automated grasping and electrically contacting of the board-shaped work pieces is achieved in particular if at least two supporting frames are provided, with said supporting frames being associated to a respective one of the sides of the work piece. In this case, the supporting frames, which are preferably connected by an axle, may be configured to be foldable into an open and closed condition like a cassette in order to receive the board-shaped work piece. In this event, the contact strips are located between the covers of the cassette. The cassette is folded open to receive the work piece. Once the work piece has been inserted between the cassette halves by means of a conventional horizontal or vertical conveying facility, said cassette halves are folded together so that the work piece is clamped therein between and is thereby placed in electric contact with the current source.

In another implementation, the work piece can be directly held and removably clamped by the supporting frames for electrolytic treatment, meaning that the supporting frames are then directly adjacent the surface in the region of the edges (of cut) of the work piece. In another embodiment, for electrolytic treatment the work piece can also be held and removably clamped by the supporting frames via the contact strips. In this case the inventors have taken advantage of the fact that it is necessary, in order to achieve efficient current transfer from the contact strips to the work piece, to provide a minimum closing force between the contact strips and the work piece. This force may of course also be used to hold the work piece. In the case of the embodiment of concern, the supporting frames exert the force on either side (front and back side) of the work piece via the contact strips. Accordingly, the latter embodiment offers advantages over the previous one. The work piece in this case, too, may likewise preferably be clamped by its edge in order to prevent touching the area on the surface of the work piece to be treated. A combination of the afore mentioned embodiments is of course also possible, meaning that the work piece may also be held and removably clamped by both the supporting frames and the contact strips, for example in the event the work piece is to be electrolytically treated on one side only so that contact strips are only provided on this side of the work piece.

The work piece is preferably received in, and held by, the supporting frames and/or the contacting frames. Next, electrolytic treatment is started by supplying electric current to the work piece through the current supply devices, preferably through the contact strips. Upon completion of the electrolytic treatment, electric current supply is disrupted and the work piece is released from the supporting frames and/or contacting frames (contact strips) and advanced by the conveying facilities.

To secure the supporting frames in a treatment tank, the supporting frames may be supported through supporting elements on supporting points in the tank. The supporting elements are preferably configured to be movable so that the position of the supporting frames relative to the supporting points in the tank may be varied. As a result, the supporting frames may be adjusted together with the work piece within a treatment tank. This embodiment offers major advantages over conventional devices for electrolytic treatment:

If counter electrodes, such as anodes for electrolytic metal plating, are for example stationarily disposed in the treatment tank, the supporting frames holding the work piece can be individually oriented relative to the position of the counter electrodes. Further, if measuring facilities, such as measuring probes disposed in proximity to the surface of the work piece, are provided to determine the effect of the electrolytic treatment onto the respective work piece, the position and orientation of the work piece retained within the treatment tank by the supporting frames can be optimized relative to the counter electrodes in order to achieve a very uniform electrolytic treatment. Such an optimization is made possible by moving the supporting elements, with such supporting elements being for example provided on a respective one of the corners on either side of a rectangular cassette consisting of two supporting frames for holding the work piece. The supporting elements are supported on opposing sides of the cassette by supporting points located on the walls of the tank for example, with eight of such supporting elements being moved in such a manner that the spacings between the work piece and the counter electrodes are optimized with regard to the uniformity of the electrolytic effect on the work piece. Under normal condition uniformity will be achieved if the distances between the counter electrodes and the surfaces of the work piece are identical.

If more specifically board-shaped work pieces, such as an electrical printed circuit board, are treated, the supporting elements may be configured in such a manner that the printed circuit board is clamped between two supporting frames and/or contacting frames that are associated to a respective one of the sides of the printed circuit board after said circuit board has been conveyed to the frames by means of conveying facilities: The circuit board is prepared to be received in the cassette formed by the supporting frames by being conveyed between said frames. The frames are held apart for this purpose. The respective frames may for example be pivoted to one another through a common frame leg so that the cassette needs only be folded together to take hold of the circuit board. As the cassette is being folded together, the opposing side edges of the circuit board are brought into electric contact with the current source.

As a matter of course, the electrolytic treatment device also comprises counter electrodes that are disposed opposite the work piece. In a particularly preferred embodiment, the counter electrodes are mounted to the supporting frames. This arrangement is also taken advantage of to readily adjust the counter electrodes relative to the work piece. To provide optimum treatment for the work piece, the work piece needs to be accurately aligned relative to the counter electrodes. This may be achieved in particular by aligning each work piece individually, this in turn being achieved if the counter electrodes and the work piece are disposed in one common cassette that is formed by the supporting frames and/or the contacting frames.

In another improvement of the invention, the counter electrodes are disposed substantially parallel to the work piece and are movably carried on the supporting frames to which they are mounted. The counter electrodes are preferably mounted in such a manner that they are slidable parallel to the surface of the work piece. Inhomogeneities (irregularities) on the surface of the counter electrodes are thus compensated during electrolytic treatment by constantly or at least intermittently (cyclically) moving the counter electrodes parallel to the surface of the work piece during treatment. It is advantageous to move the counter electrodes in order to prevent them from leaving an impression in the form of differences in coating thickness on the printed circuit board, said impression being the result of possibly occurring irregularities in the geometrical shape and/or of the electric conductivity of the counter electrodes. Irregularities on the counter electrodes may for example be the result of passive sites (for example through unintended wear) or of fluid passage ports (necessary voids) in the counter electrode. Moving the counter electrodes aims at achieving that such type voids in the counter electrodes distribute evenly for possibly the same period of time over the surface of the printed circuit board.

The same effect can of course be achieved by stationarily disposing the counter electrode and by moving the work piece together with the contact strips instead.

Even if the counter electrodes are moved parallel to the surface of the work piece during electrolytic treatment, the size of the counter electrodes is preferably chosen so as to approximately correspond to the electrolytically to be treated useful area on the work piece (without edges of cut). Since the area of the counter electrode may have about or even exactly the same size as the useful area on the printed circuit board, excess metal is prevented from depositing in the border regions of the printed circuit board as a result of the concentration of the electric field lines in the border regions. Optimum thickness uniformity of the metal deposit is achieved if the moving counter electrode area covers the useful area of the printed circuit board just enough to prevent the surface of the counter electrode from ever directly opposing the border regions in order to prevent electric field lines to concentrate on these border regions. Separating membranes may also be disposed between the counter electrodes and the work piece.

In another preferred embodiment of the invention, additional covers are disposed on the supporting frames and/or on the contacting frames so as to form compartments that are defined by the covers and the work piece. As a result, separate processing compartments, in which defined conditions of flow on the surface of the work piece can be adjusted, can be formed, together with the accommodated work piece, in the cassettes, which are formed by the supporting frames and/or contacting frames. More specifically, the flow through small holes in printed circuit boards can be promoted by a build up of hydraulic pressure within the processing compartment. A cover can be fluid-tight and be made from plastic boards, a tight plastic fabric or an ion-permeable membrane.

Another advantageous development of the invention consists in disposing the covers in such a manner that the counter electrodes are disposed within the closed compartments. Electrolytic cells, which are associated with each work piece, are thus formed, said electrolytic cells being formed by the respective surfaces of the work piece and the counter electrodes facing them.

In order to constantly or at least intermittently supply the electrolytic cells with fresh electrolyte fluid, feed lines for feeding the processing fluid to the closed compartments and drain lines for carrying the fluid off the closed compartments are provided in the covers and/or the supporting frame.

As a result, in a preferred embodiment, the device in accordance with the invention is configured in such a manner that the supporting frames, the contact strips and counter electrodes contained in the device are movable together as one combined unit (cassette) in such a manner that the work piece can be held by this unit during electrolytic treatment while the contact strips can be brought into electrical contact with the work piece, further that the work piece may be released from said unit after the electrolytic treatment has been performed and that the electrical contact between the contact strips and the work pieces can be again disconnected.

Such a cassette may for example also be utilized for electrolytically treating work pieces in a dip plant having a plurality of treatment tanks. Prior to immersing the work piece in a first processing fluid in a first treatment tank, the work piece is, for this purpose, allowed to be received in, and held by, the supporting frames and/or contacting frames having contact strips by being removably clamped therein between. Next, the work piece being held by the cassette and brought into electric contact with the contact strips is electrically connected to the current source through removable electric contacts at the cassette and electrolytically treated. After treatment, the cassette is again disconnected from the current source, lifted from the first treatment tank and consecutively immersed into further processing fluids in other treatment tanks and, if necessary, again electrically connected to the current source and disconnected there from again. Upon completion of the treatment in the dip plant, the work piece is released from the cassette.

More specifically, such a cassette can be part of a conveyorized plating line or of a dip plant for treating work pieces in the form of electrical printed circuit boards. In this case, the inventive device in the conveyorized plating line further comprises treatment tanks that are each equipped with entry and exit regions for the printed circuit boards, with conveying devices for the printed circuit boards and with current supply conductors for the current supply devices. The cassettes holding the circuit boards are thus introduced into the device in the conveyorized line through an entry region. In the device, a printed circuit board contained in the cassette is electrolytically treated. After the printed circuit board has been electrolytically treated, the cassette is allowed to exit the device through an exit region. The conveyorized line can be comprised of a plurality of such devices having entry and exit regions. The cassettes may be supplied with current through conventional electrical contacting elements such as described in U.S. Pat. No. 4,776,939 and DE 41 32 418 C1 for example.

For treating the printed circuit boards in such type conveyorized lines, the work piece is first conveyed in a horizontal direction of transport to the supporting frames and/or contacting frames. There, it is received in, and removably clamped by, the cassette formed by said supporting frames and/or contacting frames and contact strips. Once it has been received by the supporting frames and/or contacting frames, the work piece being contained in the cassette is electrolytically treated in the conveyorized line. The counter electrodes are stationarily mounted in the respective processing stations or installed in the cassette. After the respective treatment has been performed, the work piece is released from the supporting frames and/or contacting frames so that it may be advanced to further processing devices in the conveyorized line.

For treatment in a horizontal conveyorized line, two method variants may be performed:

On the one hand, the cassette holding the work piece can remain stationary in the conveyorized line during the electrolytic treatment. In this case, the work piece is brought near to the opened cassette and is introduced therein. After the cassette has been closed and the work piece removably clamped, the latter is electrolytically treated. The cassette is not allowed to advance in the conveyorized line during treatment in this variant. After treatment, the cassette is opened again and the work piece is released so that it is allowed to be conveyed to the next processing device in the conveyorized line.

In an alternative variant of the device, during electrolytic treatment the cassette holding the work piece is conveyed in the conveyorized line in horizontal direction of transport from an entry region to an exit region. Once the work piece has been released, the cassette is moved back from the exit region to the entry region where it is intended to receive a new work piece.

For an electroplating treatment having various steps in a given order, the work piece may be treated both in electrolytic baths (with electric current being supplied to the work piece) and in chemical baths (without any electric current supply). Chemical baths do not need any current supply devices or counter electrodes. In this case, all of the elements of the processing device described herein can be provided for, the contact strips or contacting frames being replaced by other elements, e.g. holding elements, that may be configured to be folding strips or folding frames or alternatively strips or frames which are able to removably clamp the work piece by a parallel movement of these strips or frames.

It may further be advantageous to convey printed circuit boards from one treatment tank to the other without the help of a flight bar. For this purpose, a conveyor carriage for conveying the boards may be equipped with grabbers for taking hold of every single printed circuit board. In the chemical treatment tanks in such a case, holding means for the printed circuit boards must be substituted for the contacting frames (used in an electrolytic bath). These means are the aforementioned folding strips or folding frames or alternatively strips or frames which are able to removably clamp the work piece by a parallel movement of the strips or frames.

The electric current source may be a direct current source or a current source delivering pulsed current, unipolar pulse current or bipolar (reverse) pulse current for example.

The invention is best understood when read in conjunction with the exemplary FIGS. 1 through 12.

All of the Figures are schematic and not to scale.

FIG. 2a is a cross-sectional view of the details of the inventive contact strips on the supporting frame (section B-B of FIG. 1);

FIG. 2b is a detail of FIG. 2a;

FIG. 6 is a cross-sectional view of a detail of a special inventive embodiment having double contact strips that may be opened and closed like tongs; the viewing direction corresponds to that of FIG. 2a;

FIG. 7 shows the double contact strips of FIG. 6 in the opened condition;

FIG. 12 shows a vertical dip tank with two contacting frames that are slidable parallel to each other and with a printed circuit board disposed therein between.

Figure 1:
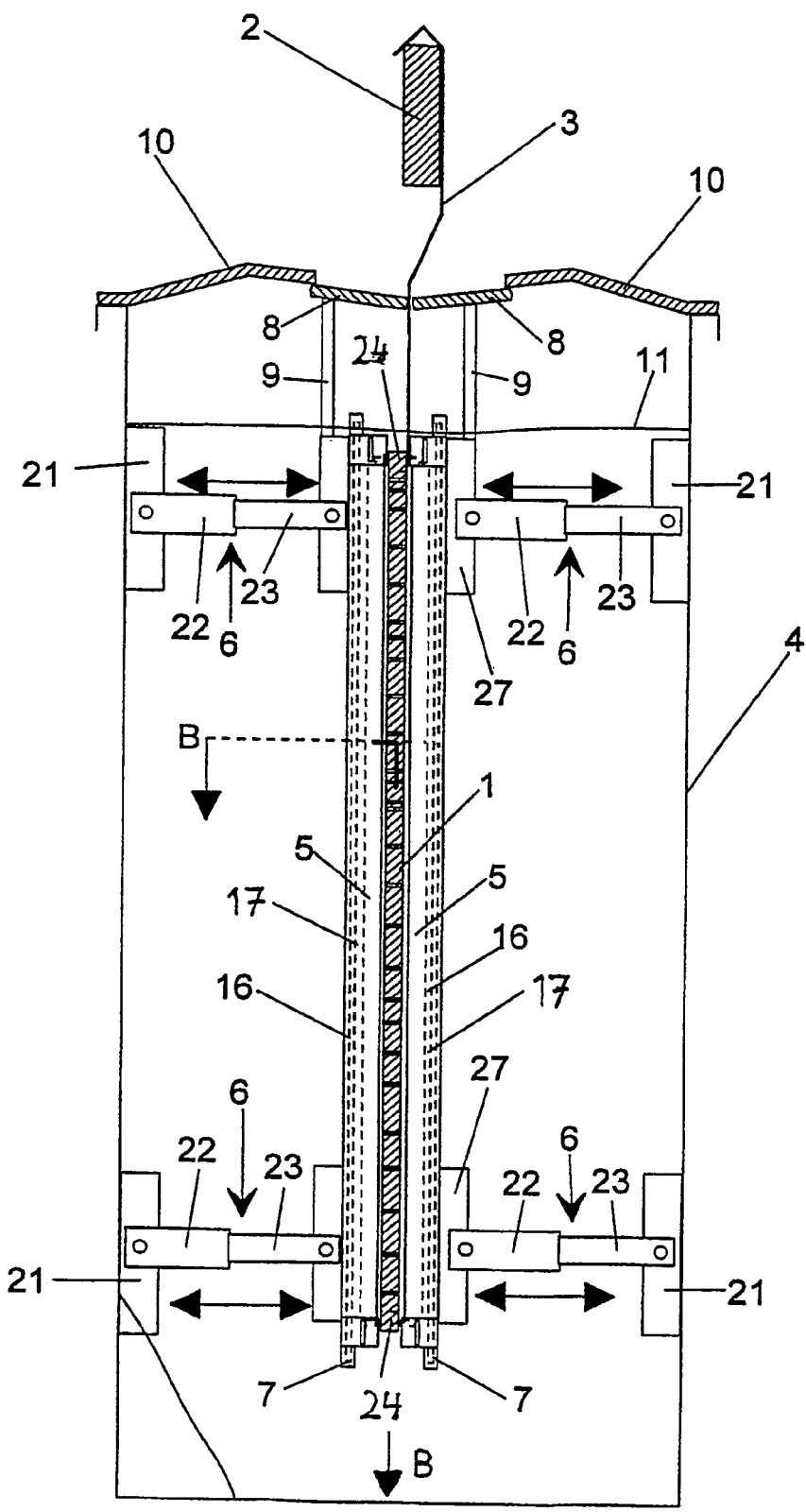
FIG. 1 is a cross-sectional view of a vertical dip tank having two contact strips according to the present invention with supporting frames, as viewed from the front.

To provide a better understanding of the invention, it is assumed herein after that the work piece is either a printed circuit board or a printed circuit foil. For simplification sake, it is always assumed that the work piece is a printed circuit board. Of course, the work piece may be any piece that is chemically or electrolytically treated in accordance with the invention.

In the following, like reference characters and numerals refer to the same parts through the different views.

FIG. 1 is a cross-sectional representation of a vertical tank 4 for electrolytic metal plating in vertical dip plants as viewed from the front. The front wall is therefore removed to better show the details.

The bath tank 4 is filled with a constantly circulated electrolyte fluid. The printed circuit board 1 having through-holes as well as the contact strips 5 abutting the circuit board 1 and a flight bar 2 holding the circuit board 1 extend into the plane of the drawing. In principle, the contact strips 5 are not only suited for electrically contacting the printed circuit boards 1 but also for other type of work pieces as long as the work piece 1 can be contacted in the border region thereof. The printed circuit board 1 blank is generally of greater dimensions than the finished board. For this purpose, the outer border of the circuit board 1 is later cut off on all of the four sides. This edge of cut 24 is used for example to make registration bores or to attach and electrically contact the printed circuit board 1 in this region. In practice, the edge of cut 24 has a width of at least 10-12 mm. In FIGS. 2a and 2b, the edge of cut 24 is denoted as a dashed line separating the edge of cut 24 from the printed circuit board 1. The printed circuit board 1 is fastened to the flight bar 2 through a work piece holder 3.

Alternatively, the conveyor system can take hold directly of the printed circuit board 1 by the upper edge of cut 24 thereof by means of grabbers (not shown) and move it to the processing station and withdraw it there from. For loading the processing station the board 1 is lowered into the bath tank 4 and then grasped and concurrently brought into electric contact with the current source by means of the contact strips 5. Accordingly, the flight bar 2 may be totally absent.

The contact strips 5 are made from a plastic material and have a metal insert or they are made from metal, in which case they are provided, except for the contacting regions, with an insulating coating to prevent the surface of the contact strips 5 from acting as an electric conductor and, as a result thereof, as a thief cathode. In FIG. 1 there are provided a front and a rear contact strip 5 for treating the front and the rear side of the printed circuit board 1, respectively. The contact strips 5 have to exhibit relatively high stiffness to enable the spring-loaded contact elements 14, shown in detail FIG. 2b, to be placed in contact with uniform pressure.

The contact strips 5 are fastened within the bath tank 4 through a respective supporting frame 17 so as to be horizontally slidable (see also FIG. 2a). The contact strips 5 are fastened to, and supported by, the wall of the tank 4 through the supporting frames 17, through mounting boards 27 provided on the side of the supporting frames, displacer pistons 23, displacer cylinders 22 and mounting boards 21 provided on the side of the tank 4. Together with the contact strips 5, the supporting frames 17 can be displaced in a horizontal direction in the direction of the arrows shown by actuating the displacer pistons 23 inside the displacer cylinders 22 in order to receive and thereafter removably clamp the circuit board 1. The distance of displacement of the supporting frames 17 depends on their tendency to swing as the printed circuit board 1 is being lowered into the bath tank 4, since generally said circuit board 1 cannot be fastened to the flight bar 2 or the grabber of the conveyor carriage so as to hang in an exactly vertical position, as well as on the thickness of the printed circuit board 1. In practice, a clearance of 50-100 mm between the contact strips 5 and the printed circuit board 1 will do. To introduce the printed circuit board 1 into the tank 4, the contact strips 5 are moved together by means of the displacer cylinders 22 and the displacer pistons 23 mounted to the supporting frame 17 using an auxiliary energy (not shown) such as compressed air or of a hydraulic fluid. As a result thereof, the contact strips 5 are caused to move toward the wall of the tank 4 thus clearing the space needed to lower the printed circuit board 1 into the bath tank 4. On the side of the supporting frame 17, the displacer cylinder 22 and the displacer piston 23 are mounted to the mounting board 27 which is attached to the supporting frame 17, on the side of the tank 4 they are attached to the mounting board 21. The supporting frame 17 with the contact strips 5 can be displaced not only through the above mentioned auxiliary energy but also through motor driven drives such as an eccentric drive. The displacement enables the supporting frame 17 and the contact strips 5 to be supported by the wall of the bath tank 4 and to be fixed within the tank 4 as a result thereof.

The counter electrodes 16 required for the electrolytic process are spaced a given distance apart on one or both sides of the printed circuit board 1 and are plane-parallel relative thereto (see also FIG. 2a). This distance may range from 1 to 300 mm. The printed circuit board 1 is electrically connected to one pole of the current source which has not been illustrated herein, and the counter electrodes 16 to the other pole of the current source.

Holders 9 for holding a cover 8 of the bath tank 4 which advantageously travels together with the supporting frame 17 are mounted in the top region of the supporting frame 17. As a clearance is created between the supporting frames 17 to receive the circuit board 1 or remove same there from the parts of the cover 8, too, let a clearance be created between them in order to let the circuit board 1 to be lowered into or be withdrawn from the bath tank 4. The cover 8 serves to prevent, or at least strongly limit, escape of toxic vapor from the electrolyte fluid during the electrolytic treatment. In addition, a suction device (not shown) for also evacuating the vapors as the printed circuit board 1 is being placed into, or removed from, the tank may also be mounted to the top region of the bath tank 4.

Figure 9:
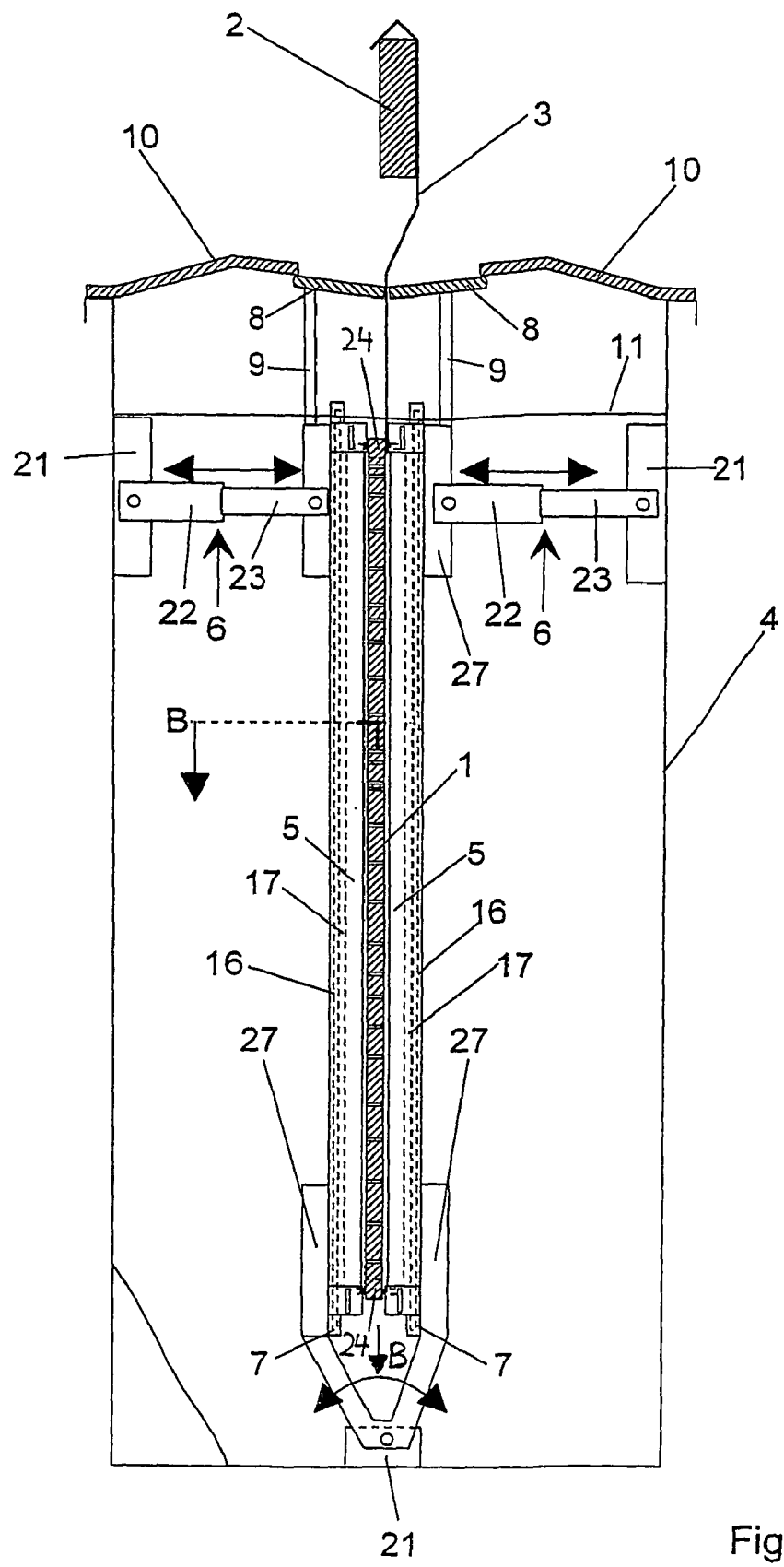
FIG. 9 is a cross-sectional view of another embodiment of a vertical dip tank, as viewed from the front.

An alternative implementation of the vertical dip tank is shown in FIG. 9. Like reference numerals as in FIG. 1 denote like elements. Here, the bottom mounting boards 27 for the printed circuit board 1 on the side of the supporting frame 17 are not supported by the side walls of the tank 4 as it is the case in the embodiment shown in FIG. 1. As contrasted to that implementation, the mounting boards 27 in this embodiment are rather formed like tongs that are pivoted through an axle in a mounting board 21 which is provided on the side of the tank 4 and is mounted to the bottom thereof. As a result thereof, the circuit board 1 can be simply clamped between the contact strips 5.

Further details of the contact strips 5 are described with reference to FIG. 2a. FIG. 2a is a cross-sectional view of one half of the device in FIG. 1, taken along the line B-B passing horizontally through one of the vertically oriented contact strips 5 and through the circuit board 1, as viewed from the top.

In the bottom portion of FIG. 2a, the vertically hanging printed circuit board 1 is shown as viewed from the top. In the Figure the counter electrode 16 is disposed there above, parallel to the printed circuit board 1. The contact strips 5 serve to electrically contact the printed circuit board 1 via their border region 24.

FIG. 2b shows a detail of FIG. 2a. It shows how the electric current is supplied to the printed circuit board 1: Current supply conductors 7 and contact elements 14 as well as electric cables (not shown) connecting the electroplating current source, which has not been illustrated herein either and serves to supply current, with the circuit board 1 serve this purpose. The latter may be implemented as a direct current source (e.g. a rectifier) or as a pulse current source. The contact element 14 may be formed as a cylindrical pin or as an elongated bar.

From the current supply conductor 7, the current is run through the contact holder 13 and a conductive spring element 12 to the electrical contact element 14. Except for the contact element 14, all of the current supply elements (current supply conductor 7, contact holder 13, conductive spring element 12) are electrically isolated or sealed against penetrating electrolyte fluid so that the elements will not get in touch with the electrolyte fluid. A seal 15 is provided for on contact element 14 for this purpose. In this example, the contact element 14 is an inexpensive to manufacture annular contact made from a chemically stable material such as titanium. The seal 15 is formed by a wear resistant, elastic O-ring made from a plastic material that is nested in a groove in the insulating housing of the contact strip 5 if the contact element 14 is a cylindrical pin. Such shape is much more efficient in sealing than any other shapes of the contact element 14 and of the seal 15. If the contact element 14 is formed as a cylindrical pin, an elongated row of such elements 14 is provided for in the contact strip 5 in order to provide electric contact between the contact strip 5 and the circuit board 1 at the entire length of the border 24 of the circuit board 1.

In order to prevent metal from undesirably depositing onto the contact element 14, when the printed circuit board 1 is cathodically polarized for electrolytic metal plating, the side areas of said contact element 14 not abutting the surface of the circuit board 1 can be provided with an electrically non-conducting insulating coating.

As the contacting area of the contact element 14 must in any event remain electrically conducting, there is a risk that metal deposits on the contact element 14 when the lateral insulating coating is damaged for example. The auxiliary electrode 26 allows to dissolve this metal. For this purpose the auxiliary electrode 26 may for example be cathodically polarized with respect to the contact element 14 while the circuit board 1 is being introduced or removed from the tank 4. Accordingly, the contact elements 14 will be anodically polarized. This is achieved using electric or electronic switching means (not shown) and the existing plating current source. A separate rectifier may also be used for this purpose. Possible metal deposits on the contact elements 14 are thus removed again. Alternatively, the counter electrodes 16 can also perform the function of the auxiliary cathode 26 with the proviso that the material used for the counter electrodes 16 is suited for cathodic operation and is not destroyed in the process. As the exposed area of the contact elements 14 is relatively small, a high current density may be applied for deplating, also using the rectifiers intended for the actual treatment, so that complete deplating can be achieved without any problem during the process of introducing or removing the printed circuit boards.

In a special embodiment of the invention, the contact elements 14 may also be made of an electrically conductive, elastic material. In this event, the seal 15 and the spring element 12 may be absent because their functions, which consist in sealing the electric conduit in the insulating housing 19, which accommodates the current supply conductor 7 and the contact holder 13, against electrolyte fluid and in exerting a uniform pressure onto the contact element 14 pressed against the printed circuit board 1, can be performed by the elastic, conductive contact element 14 itself. In this event, the contact holder 13 can be firmly connected to the current supply conductor 7 so that the connection exhibits good conducting properties, for example by screwing. If the contact elements 14 are expected to be subjected to little wear, the elastic contact element 14 may be secured directly to the current supply conductor 7 so that the contact holder 13 may also be absent.

For electric connection of the electric cables (not shown) to the current supply conductor 7, the latter is led out of the insulating housing 19 by at least one end thereof while being provided with a fluid-tight seal. The electric connection itself is sealed allover with an elastic plastic material that is chemically stable to the electrolyte fluids utilized, or is integrally molded, in order to prevent electric current from flowing between the connection or the current supply conductor 7 and the counter electrode 16.

The counter electrodes 16 may either be secured separately in the bath tank 4 or be directly mounted on the supporting frame 17 through counter electrode holders 18. FIG. 2a shows the latter implementation. In this alternative, the supporting frame 17 is provided with counter electrode guides 18.1. The counter electrodes 16 are preferably disposed opposite the circuit board 1 and parallel thereto. The counter electrode holders 18 are not firmly mounted in the slot-shaped guides 18.1 at the supporting frame 17 but are movably guided therein. As a result thereof, the counter electrodes 16 can be moved by means of suited drives (not shown), for example by means of a motor driven eccentric (with circular up and down or left and right movements), a hydraulic or a compressed air cylinder. The counter electrodes 16 can be moved with a low frequency of for example one travel per minute or faster. They need not be moved constantly during the entire electrolysis procedure. The movement may also be stopped at times.

In the FIGS. 1, 2a, 3, 4, 5, the counter electrodes 16 are shown as insoluble electrodes made for example from expanded titanium metal. In principle, soluble counter electrodes 16 may also be used, though. In this event, the counter electrodes 16 are for example implemented as a carrier being insoluble in the electrolyte fluid and receiving the metal pieces employed. Due to the greater weight, the supporting and moving members 17, 18, 18.1, 21, 22, 23, 27 must then be provided with a greater supporting force.

In order to maintain metal ion concentration in a plating bath when using insoluble anodes (counter electrodes), compounds of a redox couple (e.g. $Fe^{2+}/Fe^{3+}$ salts for a copper plating bath) and a replenishing container (not shown) preferably separate to the bath tank 4 and in communication with the bath tank 4 are provided. The replenishing container contains metal pieces (e.g. copper pieces) to be dissolved by the chemical action of the oxidized compounds of the redox couple (e.g. $Fe^{3+}$ salt), which oxidized compounds are in turn reduced to the reduced compounds thereof upon this dissolution reaction. The oxidized compounds are then recovered by electrolytic oxidation of the reduced compounds at the insoluble anode in the bath tank 4.

It is further possible to segment the counter electrodes 16 and to supply them with various voltages for example in order to compensate a voltage drop occurring within the to be treated (base) layer of metal on the printed circuit board 1 and to achieve the same current densities in all of the printed circuit board regions.

If the work piece 1 is not a flat printed circuit board as it is shown herein, an impression left by the counter electrodes 16 in the form of coating thickness differences on the work piece 1 can be selectively utilized for certain desired effects (for example electroforming). In this event, the moving system for moving the counter electrodes 16 is absent or the movement is exactly adjusted to the desired effect. Moreover, anode molds that conform to the shape of the work piece 1 may be used.

To contact the printed circuit board 1 in the border region 24 only, it is assumed that the size of the supporting frame 17 and the position of the contact elements 14 conform exactly to the shape and size of the printed circuit board 1. For particularly uniform current supply, the printed circuit boards 1 are contacted on all four sides (if the boards are rectangular). Accordingly, current is fed into the printed circuit board 1 from all four sides. The only region in which the printed circuit board 1 is not electrically contacted is the region of the holders 3 to which it is secured.

If the printed circuit board 1 is not conveyed by means of flight bars but by tongs mounted to conveyor carriages, said printed circuit board 1 can uniformly be placed in electric contact through all the side borders 24.

In order to prevent the electric field lines from concentrating in the border region 24 of the printed circuit board 1, shields 38, 39 can be mounted to the supporting frame 17 or to the contact strips 5 (or contacting frames). Here, the shields 38, 39 are oriented parallel to the printed circuit board 1. In the embodiment shown in FIG. 2a, the shield 38 is a remote shield which is disposed between counter electrode 16 and the printed circuit board 1 and is located in proximity to the counter electrode 16. The shield 39, which is termed a proximate shield, is disposed in proximity to the printed circuit board 1. The remote shield 38 generates a soft shield transition at the printed circuit board 1, whereas the proximate shield 39 creates a rather sharp transition between the shielded region on the circuit board surface and the unshielded one. The best results are obtained in combining the two shields 38, 39. For a softer transition, the shields 38, 39 may additionally be provided, in those regions of the shields that are turned toward the center of the printed circuit board 1, with holes or notches.

Since, in the preferred embodiment shown herein, a printed circuit board 1 is being held by the supporting frames 17 contacted on all four sides by means of the contact strips 5, various measurements may be taken on the circuit board 1 before and during the treatment of the board 1. For example, a comparison measurement of the electrical resistances on the board 1 between the contact strips 5 in the four border regions 24 of the board 1 and a counter electrode 16 can be taken prior to switching on the electrolysis current, this measurement permitting to readily detect deviations from reference commands and for example to trigger an alarm in the event of unacceptable deviations.

The amount of deposited metal can for example be determined with precision in the light of the known surface area of the various circuit boards 1 that is operative in the electrolytic treatment and of a charge measurement during the electrolysis treatment (ampere-hours count of the consumed current) and, in the event of deviations from the reference value, the metal deposition time may be extended or the current density increased for example.

All of the measurements can be acquired and recorded using a connected computer system. Faults may thus be inferred there from at a later stage as well, permitting selective correcting measures to be taken.

The flight bars 2 in vertical lines, move the printed circuit board 1 by means of conveyor carriages (not shown) from one processing device (processing station) to the next one. Another advantage of the invention is that these bars 2 need not be electrically conductive. The same applies to the holders 3. Here, the current is run directly to the printed circuit board 1 through the contact strips 5. Therefore, a light, electrically non-conductive material may be used for the flight bars 2 and holders 3. If the conveyor carriage is provided with controlled tongs or grabbers of its own that are capable of taking hold of the work piece 1 at the entry station and of holding them during the transport, the flight bar 2 may even be absent. The conveyor carriage (not shown herein) for the flight bars 2 may then be provided with a reduced carrying capacity compared to conveyor carriages in conventional lines.

As the conveyor carriage is freely movable above the path of travel of the printed circuit board 1, additionally provided processing devices may be approached in the event deviations from the reference value are measured on individual printed circuit boards 1 in order to compensate for deviations detected by control measurements. If, due to a damage for example, an increased transition resistance is noticed on one contact strip 5, the printed circuit board 1 of concern can be subjected to a post-treatment in a special processing station in which at every single one of the contact strips 5 individual current and voltage values can be set. Accordingly, in this case, the printed circuit board 1 is supplied with current through only that border region 24 through the contact strip 5 of which the failure was measured.

Likewise, the printed circuit board 1 can be subjected to post-treatment in another bath holding a special electrolyte if for example a measurement of the brightness of the electrolytically deposited metal layer, which was taken at the end of the treatment, is indicative of a deviation from the reference value. For this purpose, the process for conveying the printed circuit board 1 can be triggered automatically through a suited control system for conveying the printed circuit board 1. Once the printed circuit board 1 has been transferred to a repair station, a special control programme for repairing the failure can be run. Such a programme may for example also include that excess metal deposited onto the printed circuit board 1 is removed again by reversing the polarity of the plating current source at the printed circuit board 1 of concern (deplating mode). By shielding the supporting frame 17, deplating may be carried out at one printed circuit board 1 while metal plating is performed at another printed circuit board 1.

As it is possible, in printed circuit board manufacturing, to treat one single printed circuit board 1 with each supporting frame 17 having the contact strips 5 (or a contacting frame), appropriate process parameters can be controlled during manufacturing of this printed circuit board 1 by the selective online measurement of current, voltage, charge (ampere-hours), potentials and for example the flow rate of processing fluid on certain sites of the printed circuit board 1 much more accurately than with the known devices.

Figure 3:
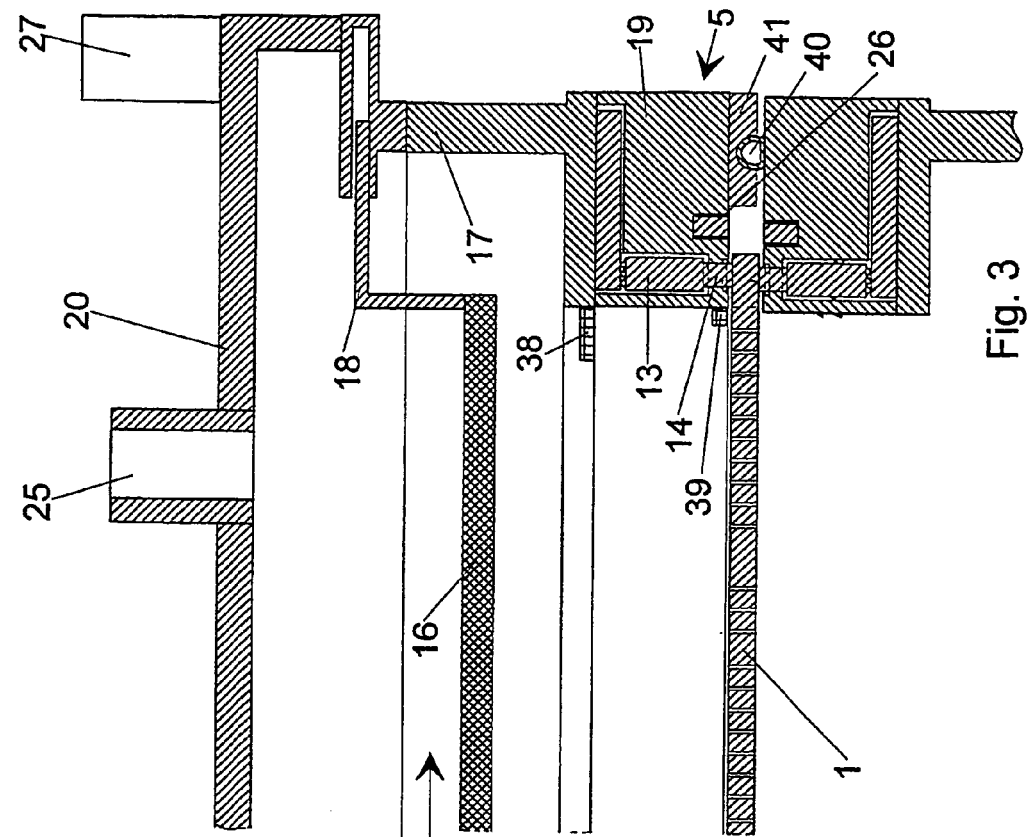
FIG. 3 is a cross-sectional view of the contact strips with supporting frames having an additional rear cover.

FIG. 3 represents the same view of the device in accordance with the invention as FIG. 2a. The reference numerals in this Figure correspond to like numerals in FIG. 2a and FIG. 2b. In this Figure, the contact strips 5, which are shown in a cross-sectional view as view from the top and are secured to the supporting frame 17 in the form of a closed contacting frame, are complemented by a rear frame cover 20. It has been found out that the movement of the electrolyte fluid greatly affects the treatment result of electrolytic metal plating and electrolytic etching. The rear cover 20 serves to control the flow of the electrolyte fluid and to enhance the flow through the vias in the printed circuit board 1. Accordingly, during the electrolytic metallization of printed circuit boards 1, electrolyte fluid can be supplied to the front side of the circuit board 1 through tubes 25 by means of a pump (not shown) at for example a higher pressure than to the rear side of the circuit board 1. The thus obtained pressure drop leads to an enhanced flow through the fine through-plated vias of the circuit board 1. Another possibility of controlling the fluid flow is to lay the feed tubes 25 on either side of the cover 20 in the bottom region thereof and to allow the electrolyte fluid that has been caused to flow through the supporting frame 17 to exit at the top (or vice versa) through ports in the cover 20 or in the supporting frame 17. As the space between the circuit board 1 and the rear supporting frame cover 20 is relatively small, it is possible to achieve, with moderate pumping capacity, a very high and uniform flow rate over the entire width of the circuit board 1. The mass transfer at the surface of the circuit board 1 and the suction effect in the vias and blind vias (Venturi effect) are considerably improved and more uniform.

The embodiment shown in FIG. 3 differs from the embodiment of the device in FIG. 2a in that the contact strips 5 are sealed against the outer space between the covers 20 (only one cover 20 is shown) during reception of the printed circuit board 1 and closure of the electrolyte compartments. A sealing frame 41, which is secured to one of the contacting frames 5 and surrounds the entire periphery of the electrolyte compartment, and a seal 40 embedded in said sealing frame 41 serve this purpose.

Figure 4:
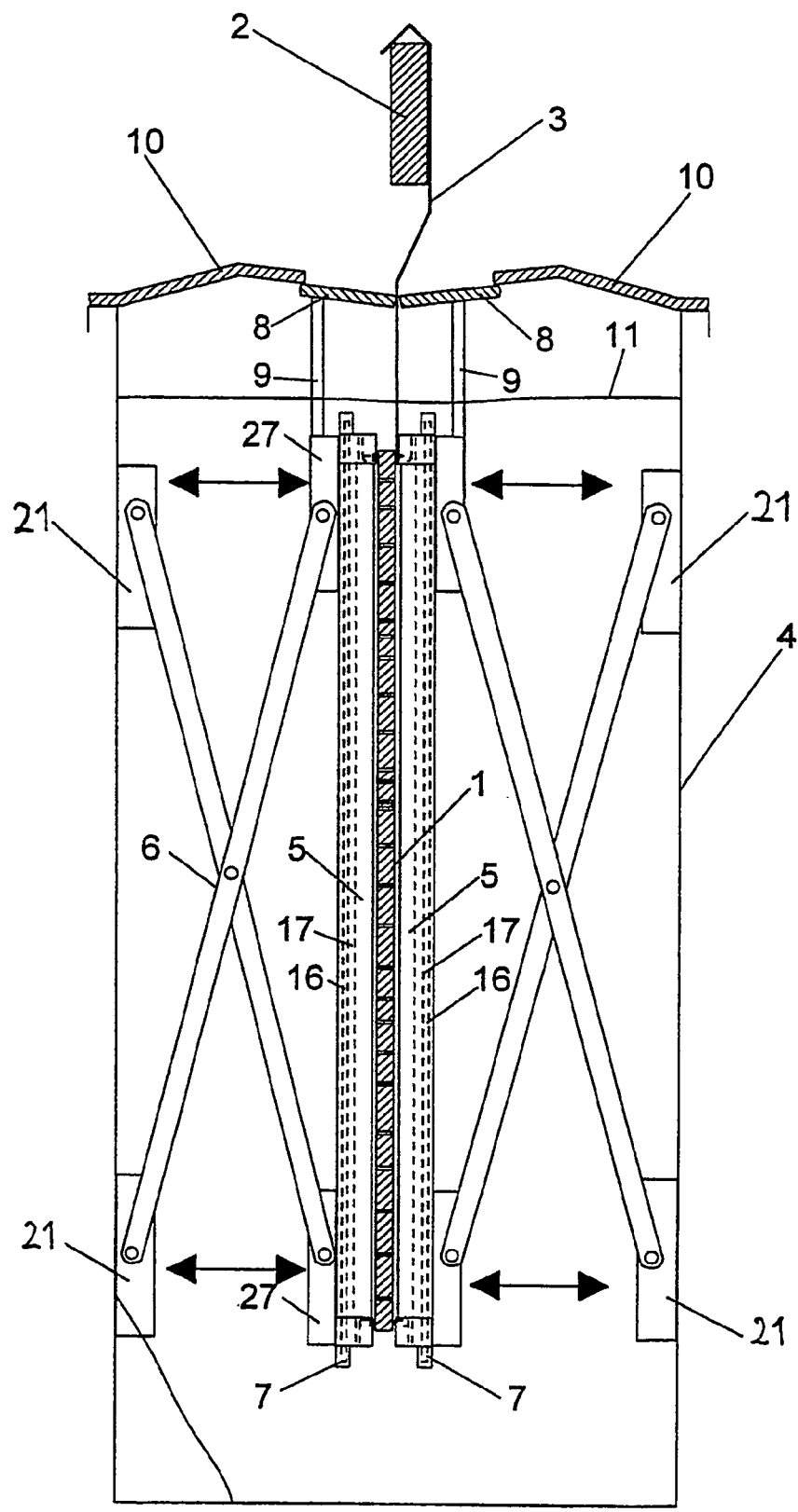
FIG. 4 is a cross-sectional view of a vertical dip tank with two inventive contact strips similar to FIG. 1, as viewed from the front.

FIG. 4 shows the same bath tank 4 as FIG. 1. The reference numerals in FIG. 4 corresponds to like numerals in FIG. 1. However, the drive for the movement of the two supporting frames 17 shown has been changed as compared to that in FIG. 1. The displacer cylinder 22 and the displacer piston 23 for each supporting frame 17 have been replaced by cross-rods 6 that will perform the function of holding the supporting frame 17 and the possibly existing additional elements such as the counter electrodes 16 and possibly the rear supporting frame covers 20 (not shown herein) and of displacing them.

The contact strips 5 are opened and closed through a shear mechanism. The drive for the cross-rods 6 has not been illustrated herein. Eccentric drives, hydraulic cylinders, compressed air cylinders or the like are suited for use as a drive.

Figure 5:
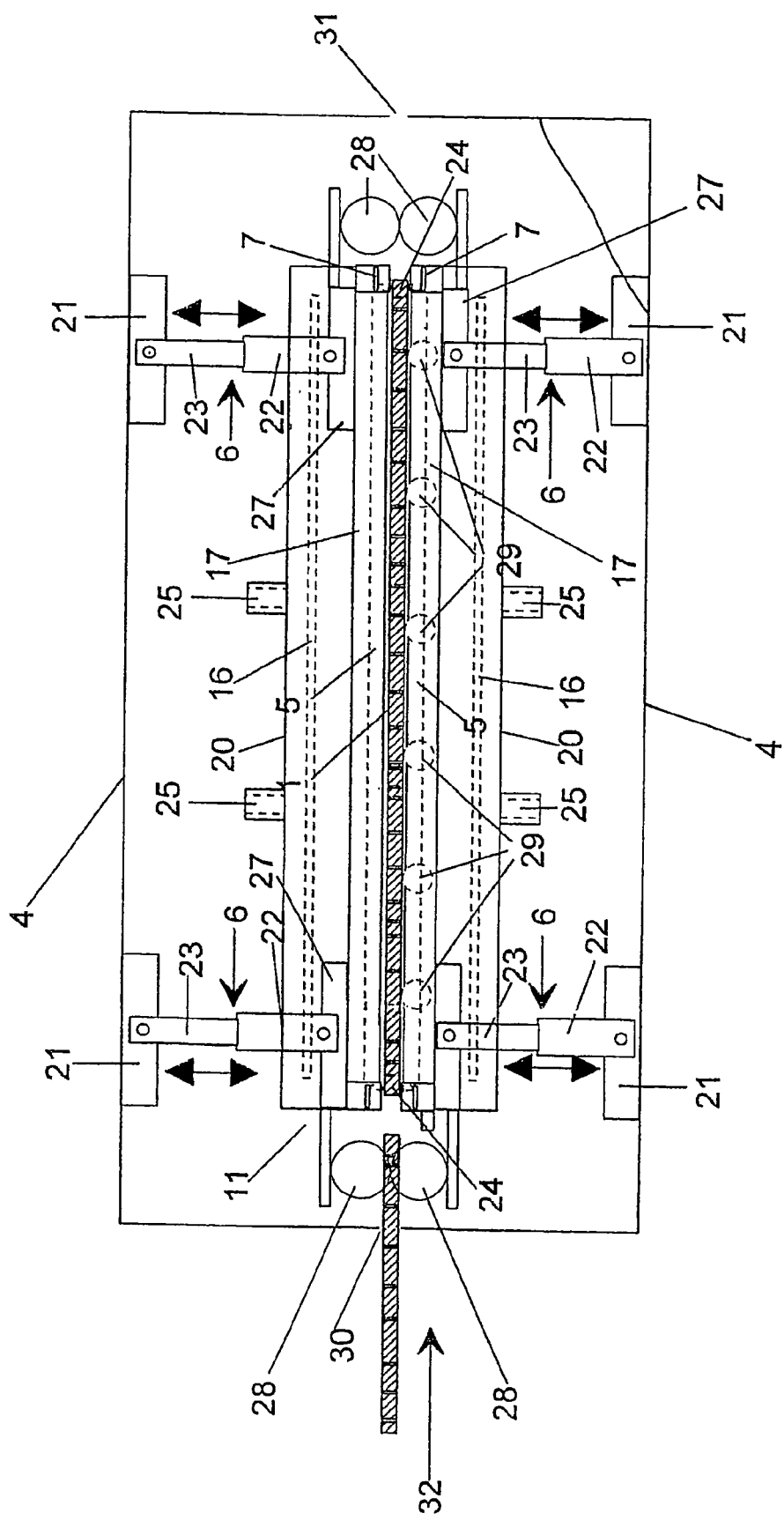
FIG. 5 is a cross-sectional view of a horizontal electroplating module with contact strips in accordance with the invention, as viewed from the front.

FIG. 5 shows the application of contact strips 5 in a horizontal conveyorized line. For increased clarity, the front wall of the tank is removed, the work piece 1 is shown in a sectional view.

The printed circuit boards 1 are not conveyed through an electrolytic processing cell continuously but intermittently. For the production of thicker layers, a plurality of such cells (electrolysis devices) may be disposed behind each other in a conveyorized plating line. If the intermittent electrolytic treatment is intended to be combined with a continuously conveyorized pre- and post-treatment, it is necessary to provide for a buffer in front of, and if need be, behind the electrolytic processing cell, said buffer permitting to place the circuit boards 1 ready for discontinuous operation in due time. In the present example, the circuit boards 1 are caused to enter the electrolytic processing cell from the left, shown by arrow 32. Conveying rollers 29 serve to convey the circuit boards 1 in this direction. In order to prevent the conveying rollers 29 from undesirably shielding the electric field lines, said rollers are preferably only disposed on the edges of cut 24 (not shown in this Figure, correspond to those in FIG. 1) which laterally extend in the direction of transport 32 between the contacts. At the entry and exit region of the electrolytic cell, additional supporting rolls may be disposed between the contact strips 5 that are arranged transversely to the direction of transport 32. As the circuit boards are entering the electrolytic cell, the supporting frames 17 with the contact strips 5 are open, meaning they have been removed from the printed circuit board 1 upward, and possibly also downward. In this condition, the current is switched off and the electrolyte fluid is in the bottom region of the tank 4. Upon completion of the treatment, a printed circuit board 1 exits the electrolytic cell through the port 31 with the help of the conveying rollers 29 in this position. Simultaneously, another board 1 to be treated is introduced through port 30. Once the circuit board 1 has adopted the right position, the drive (not shown) of the conveying rollers 29 is switched off and the top, and possibly the bottom, supporting frames 17 are moved vertically against the horizontal circuit board 1 until the contact elements (not shown) at the contact strips 5 have established a secure low-impedance electrical connection to the rectifier (not shown). Then, the moving drive (not shown) for moving the supporting frames 17 is switched off and circulation pumps (not shown) for the electrolyte fluid are switched on. The electrolyte fluid is thus delivered to the electrolytic cell through the tubes 25. As the contact strips 5, together with the supporting frames 17 and the rear supporting frame covers 20, completely enclose the circuit board 1, the electrolytic cell is filled with electrolyte fluid in no time. Sealing rollers 28, which prevent electrolyte fluid residues from escaping through the entry and exit ports 30, 31 during the opening of the supporting frame 17, may additionally be mounted to the entry 30 and to the exit 31, respectively.

Figure 8:
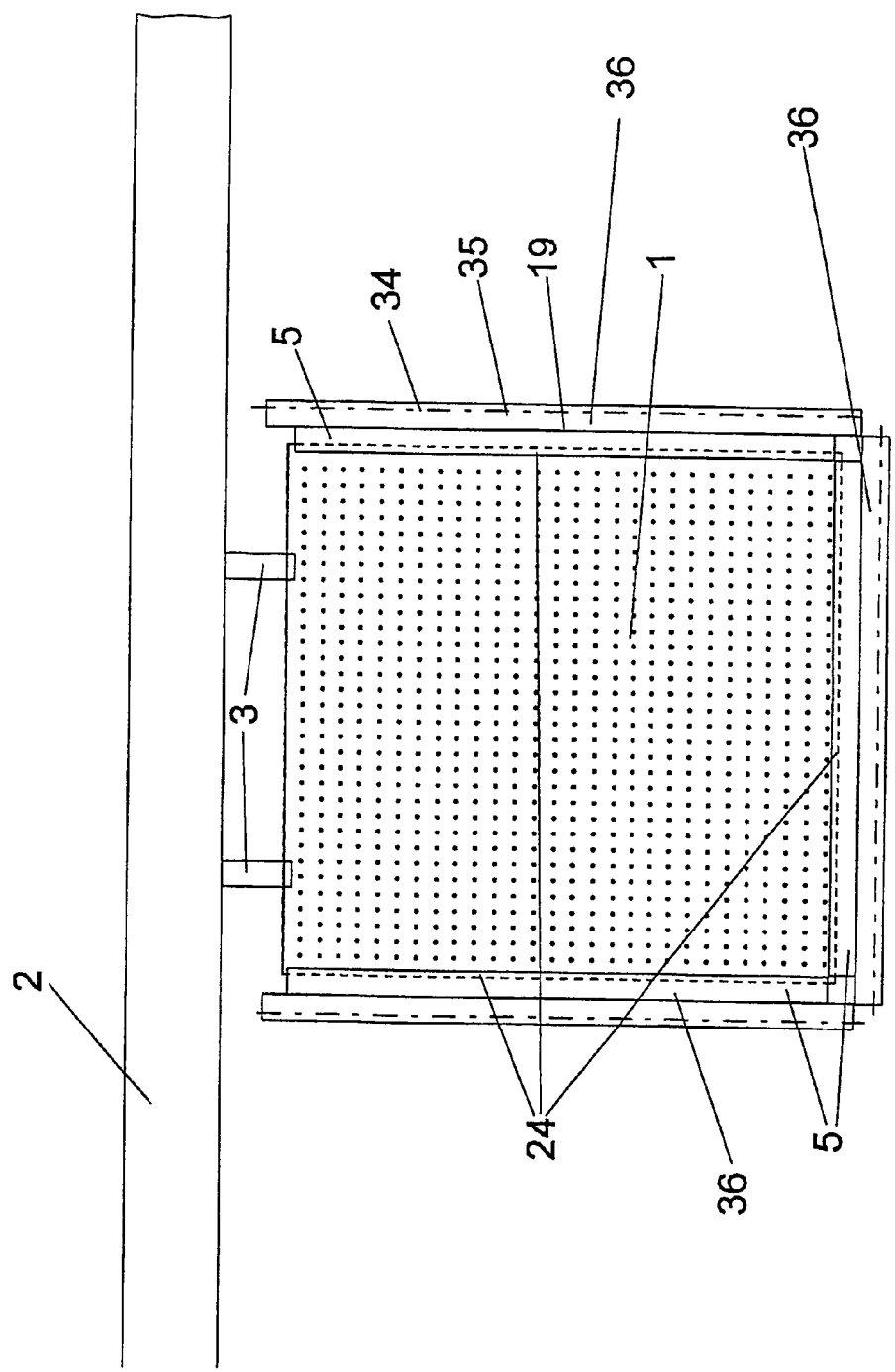
FIG. 8 shows an arrangement of double contact strips disposed on three sides of the work piece, a printed circuit board in this case, as viewed in the direction C denoted in FIG. 6.

FIGS. 6, 7 and 8 show specific embodiments of the device in accordance with the invention. In these cases, the supporting frame described hereto before that opens rearward has been substituted for two supporting frame parts, said supporting frame parts being formed by double contact strips 36 that open in the fashion of tongs (FIG. 8) and each have contact strips 5 comprised therein (FIGS. 6, 7). The double contact strips 36 are retained on a common supporting frame part 37. Three double contact strips 36 hold of and contact one vertically positioned printed circuit board 1 by the edges of cut 24, both on the bottom and on the sides. At the entry and removal side (side at which the printed circuit board 1 is held by the flight bar 2 through the holders 3), there is no double contact strip 36 so that the printed circuit board 1 can be introduced into, and removed from, the electrolyte fluid without hindrance.

FIG. 6 shows a detail of such a double contact strip 36 in the same viewing direction and illustration as in detail A in FIG. 2b. To introduce the printed circuit boards 1 into the electrolytic cell, and to remove them there from, the double contact strips 5 are opened by causing them to rotate about axle 34 instead of having the supporting frames on either side of the printed circuit board 1 being moved apart. The double contact strips 36 may also be closed again by causing them to rotate about the same axle 34 in the opposite rotation direction. The various elements of the device within the insulating housing 19 are identical to those of FIG. 2b. The holding arms 35, the axle tube 33 and the axle 34 are provided for holding the contact strips 5. The axle 34 is secured to a common supporting frame part 37 through elements that have not been illustrated. Likewise, the drive for this motion of rotation for opening and closing the contact strips 5 (not shown) can be mounted to said common supporting frame part 37.

FIG. 7 clearly shows how the printed circuit board 1 is introduced and removed. FIG. 7 shows the double contact strip 36 of FIG. 6 in the open condition. In this position, the double contact strip 36 is rotated about the axis 34 and the contact strips 5 are open in the manner of tongs. The printed circuit board 1 is thus released and is, in this position, free to be removed from the device or moved toward the feed region (see arrow) without hitting something and without being scratched. For a better understanding, FIG. 8 shows the arrangement of the three double contact strips 36 on the three edges of cut 24 of the printed circuit board 1. The viewing direction illustrated in FIG. 8 is referred to with "view C" in FIG. 6. One advantage of this embodiment is that the double contact strips 36 permit to bring counter electrodes 16 (as shown in FIGS. 1, 2a, 3, 4) very close to the circuit board 1. In order to move the counter electrodes 16 close to the circuit board 1 during the electrolytic treatment, additional moving facilities are required. In this case, a rear supporting frame cover 20, such as the one shown in FIG. 3, can be firmly connected to the movable counter electrode 16.

Figure 10:
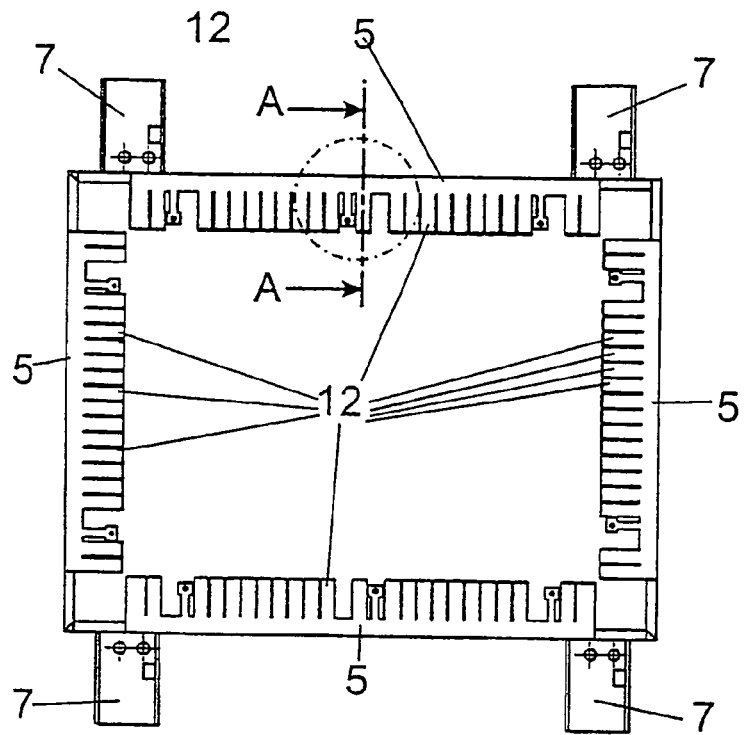
FIG. 10 is a preferred embodiment of a contacting frame, comprising four contact strips, made from a resilient flat material.
Figure 11:
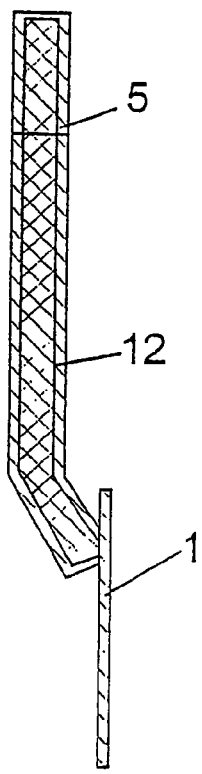
FIG. 11 is a sectional view through the contacting frame of FIG. 10 taken along line A-A, as viewed in the direction denoted in FIG. 10.

A simple embodiment, which proved efficient in practice, of a contacting frame comprising four contact strips 5 is shown in FIG. 10 and is illustrated in detail in a sectional view taken along line A-A in FIG. 11.

In this embodiment, the contact strips 5 consist of an electrically conducting, resilient flat material to which current supply conductors 7 are screwed, soldered or welded.

Approximately evenly spaced, narrow grooves are milled in the contact strips 5 so that the inner side of the contact strips 5 is provided with many lamellae 12 which concurrently perform the function of transmitting the electric current to the printed circuit board 1 and thus also perform the function of the elements referred to with the reference numerals 13, 14 in FIG. 2b.

As can be seen from FIG. 11, the lamellae 12 have a bent front edge that is ground to be plane-parallel to the contact strip 5. As a result, said front area can rest evenly on the printed circuit board 1. As is also shown in FIG. 11, an insulating coating is furthermore provided, said coating enclosing the contact strips 5 and the integrally formed lamellae 12 except for the regions that are slightly ground and are resting on the printed circuit board 1. The electrically conducting contact area can be formed by slightly grinding the lamellae that are initially completely coated with the electrically non-conducting coating. Accordingly, the ground area forms the contact area for electrically contacting the work piece 1.

Figure 12:
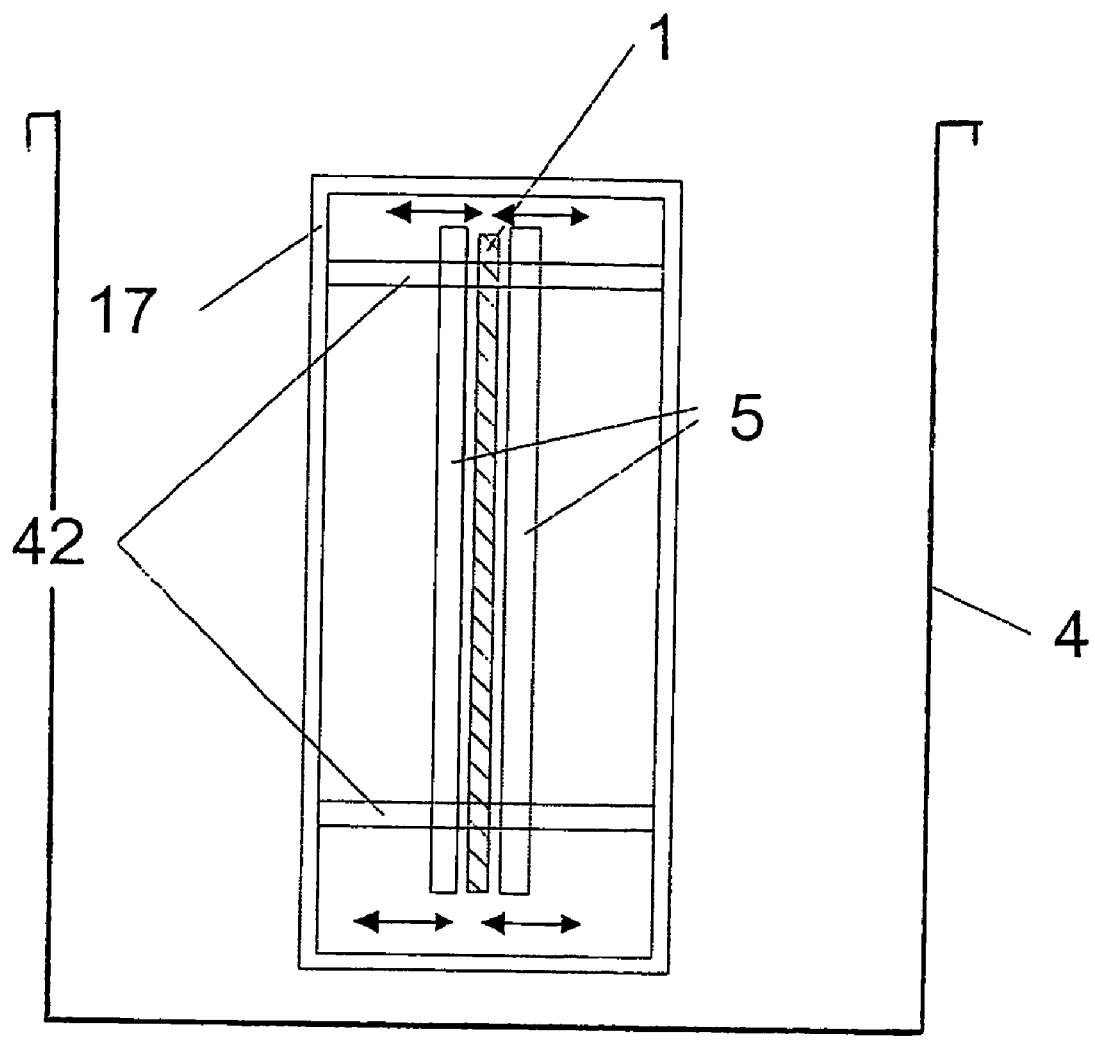

FIG. 12 shows yet another preferred embodiment of the device in accordance with the invention in which a printed circuit board 1, which is standing vertically in a treatment tank 4, is retained by two contacting frames that are also standing vertically on either side of the work piece 1 and are formed by four contact strips 5 which extend parallel to the sides of the printed circuit board 1. The contacting frames are connected to a supporting frame 17 through holding members, said supporting frame 17 being secured in the bath tank 4 through holders (not shown herein). The contacting frames can be displaced parallel to each other in the direction of the arrows by means of motion drives (not shown), with the printed circuit board 1 being removably clamped or released in the process.

The contacting frames may for example be implemented as shown in FIG. 10. To displace the contacting frames parallel to each other, the facilities shown in FIG. 1 and FIG. 4 may be utilized. In another embodiment, the current supply conductors 7 (shown in FIG. 10) on the four corners of the contacting frames are configured to be holding plates serving to hold and guide the contacting frames. Bushings (not shown) are provided in the holding plates. Four round guide axes 42, which allow the bushings to be displaced, are provided on the supporting frame. As a result, the contacting frames can be precision guided back and forth in the horizontal direction. Using a motor driven deflector rod system that has not been illustrated herein, the two contacting frames are caused to move apart (away from the printed circuit board 1) to open and to move toward each other to establish a contact and to clamp the work piece or to disconnect the work piece and release same.

The description given herein above always assumes that the printed circuit board 1 is to be electrolytically treated on both sides. If however, but one side is to be treated, one of the two contacting frames and/or supporting frames and all the associated elements may be absent. Alternatively, the contacting frame and/or supporting frame which are omitted may be replaced by a rear cover 20 (FIG. 3) with feed and drain lines for the electrolyte if this is advantageous for the treatment, meaning if for example the electrolyte is intended to flow through through-holes in the printed circuit board 1.

As edges of cut 24 are also customary in the treatment of thin flexible printed circuit foils 1 which are not shaped like a board but are rather utilized in the form of a tape and are conveyed from one roll to the other (reel-to-reel, roll-to-roll), the invention may also be used to process such type foils in conveyorized plating lines. In this event, the printed circuit foils 1 are conveyed intermittently instead of continuously.

If electrolytic treatment is not necessary (e.g., in any of the processing stations of a treatment line), the current supply devices and the counter electrodes may be absent. In this event, the other elements of the treatment device described herein may be provided for:

Referring to FIG. 1 for example, the contact strips 5 and contacting frames may be provided without said elements having the function of transmitting electric current to the printed circuit boards 1, though. The contact strips 5 and contacting frames may possibly also be completely absent so that the printed circuit boards 1 are held by the supporting frames 17 only.

For treating the printed circuit boards 1 chemically (e.g., in any of the processing stations of a treatment line), a special version of the supporting frame 17 may be used referring for example to FIGS. 2a, 2b, in which the current carrying elements 7, 12, 13, 14, 26 of the contacting device are simply omitted. For the rest, the embodiments of the device and method for such a chemical treatment do not differ from the embodiments for electrolytic treatment according to the present invention as described herein. The printed circuit boards 1 may be treated chemically using electroless metal plating and chemical etching. Accordingly, an invention is also considered of major importance for the present application in which the current supply devices are not provided for or are not used in all of the processing stations of a line. The features of such a device correspond to those described herein above, with the contact strips 5 having however to be replaced here by strips 5 the function of which is not to transmit electric current to the printed circuit boards 1. If necessary, the strips 5 may in this case also be totally absent. In this case, the printed circuit boards 1 can be retained by the supporting frames 17 only.

Herein after, another embodiment will be described, which is also considered as being of major importance to the invention:

In this device for processing preferably board-shaped work pieces with processing fluids, the work piece is clamped between two cassette halves, said two cassette halves resting on the surfaces of the work piece so as to be fluid-tight. This makes it possible to introduce the processing fluid into the sealed compartments between a respective one of the cassette halves and a surface of the work piece for treating the surfaces. As a result, the treatment is considerably facilitated as compared to conventional ways of proceeding since the work piece needs not be conveyed to the various treatment baths. Here, the various processing fluids are supplied one after the other to the sealed compartments and are brought into contact with the surfaces for the time required by the respective treatment. After treatment, the fluid is evacuated from the sealed compartments, and a new processing fluid is admitted. Another advantage is that the work piece may be selectively contacted with the flow of fluid since the work piece can be positioned with greater accuracy in the cassette than this is the case with conventional processing lines.

The device and the method of the further embodiment are more specifically suited for use in rinsing processes. In case the device is utilized for rinsing processes only, the cassette halves can take hold of the work piece in corresponding rinsing modules of a conventional processing line and can enclose them to form sealed inner compartments. Then, the rinse waters are admitted into the inner compartments and evacuated again after a given time. If the device is intended to be used for all the processing steps in a processing line, the cassette halves may take hold of the work piece at the beginning of the treatment so that the sealed inner compartments are allowed to form between the respective one of the cassette halves and the surfaces of the work piece. The various processing fluids for treating the surfaces are supplied one after the other to the inner compartments and are evacuated after treatment. The cassette holding the work piece can remain stationary during the treatment.

In the cassette, the work piece can be treated both chemically and electrolytically while being supplied with current. If an electrolytic treatment is desired, the cassettes may be formed in the way mentioned in the description given herein above, meaning it may be provided with current supply facilities that are configured as contact strips provided on opposing side edges of the work piece and are capable of electrically contacting the (substantially) opposing side edges of the work piece. Accordingly, the cassette may also comprise supporting frames to which contact strips may be secured. Frame covers may further be provided, said frame covers forming the individual cassette halves. The contact strips may seal the inner compartments against the outer space, or separate sealing strips with corresponding annular seals are provided, said seals being hollow within and being inflated for providing a seal. Thus, in the event that only some single processing steps are to be performed in the device, said device may comprise the following features:

a bath tank which is filled with constantly circulatable electrolyte fluid, a conveyor system for transporting the work piece into the electrolytic cassette and out of it or for discontinuously moving the work piece in a horizontal position through the electrolytic cassette, supporting elements to which are secured supporting frames with contact strips and a rear frame cover, the size of the frame being dimensioned such that the contact strips take hold of the work piece at the edges of cut only, a moving system for moving the supporting frame with the contact strips and the rear frame cover toward the work piece and for pressing them there against prior to electrolytic treatment and for moving the supporting frame with the contact strips away from the work piece after electrolytic treatment so as to permit to remove the work piece from, and to introduce a new work piece into, the cassette.

In an alternative embodiment, the contact strips may be replaced by other electric current supply conductors such as clamps, or the contact strips may be provided with lamellae intended to establish electrical contact (see FIGS. 10, 11). In these cases, the inner compartments of the cassette are sealed against the outer space through other means, for example through supporting frames that fit on the surfaces of the work piece or through mutually adjacent supporting frames (FIG. 3). Counter electrodes are of course provided for electrolytic treatment, said counter electrodes being located in the sealed inner compartments.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

LISTING OF NUMERALS 1 work piece, printed circuit board
2 flight bar (in vertical dip plants only)
3 work piece holder
4 bath tank, treatment tank
5 contact strips
6 motion drive for supporting frames 17
7 current supply conductor
8 movable cover for entry port
9 holder for cover 20
10 stationary cover 20
11 bath level
12 conducting spring element
13 spring-loaded contact holder
14 (exchangeable) contact element
15 seal
16 insoluble counter electrode
17 supporting frame
18 counter electrode holder
19 insulating housing for current supply conductor 7
20 rear supporting frame cover
21 mounting board located on the tank, supporting element
22 displacer cylinder
23 displacer piston
24 edge of cut, edge of printed circuit board 1
25 electrolyte feed and drain tubes
26 auxiliary electrode for deplating
27 mounting board on the supporting frame
28 sealing roller
29 conveying roller
30 entry port
31 exit port
32 direction of transport
33 axle tube
34 axle
35 holding arm
36 double contact strip
37 common supporting frame part carrying the double contact strip 36
38 remote shield
39 proximate shield
40 seal
41 seal frame
42 guide axis

The invention claimed is:

1. A device for electrolytically treating an at least superficially electrically conducting work piece (1) having substantially opposing side edges (24), said device comprising current supply devices for the work piece, said current supply devices each comprising contact strips (5) for electrically contacting the work piece (1) at the substantially opposing side edges (24);

the contact strips being permanently mounted in a treatment tank so that the contact strips receive a work piece that is to be electrolytically treated and the contact strips hold the work piece in the treatment tank during the electrolytic treatment of the work piece, wherein the permanently mounted contact strips are movable within said treatment tank.

2. The device according to claim 1, wherein the contact strips (5) are configured in such a manner that they are capable of holding the work piece (1).

3. The device according to claim 2, wherein at least two respective contact strips (5) are combined in one contacting frame and two contacting frames are guidedly movable toward each other or away from each other for opening and closing so that the work piece (1) can be removably clamped between the contacting frames.

4. The device according to claim 2, wherein the contact strips (5) are secured to a supporting frame (17).

5. The device according to claim 2, wherein the device comprises counter electrodes (16) that are disposed opposite the work piece (1).

6. The device according to claim 1, wherein at least two respective contact strips (5) are combined in one contacting frame and two contacting frames are guidedly movable toward each other or away from each other for opening and closing so that the work piece (1) can be removably clamped between the contacting frames.

7. The device according to claim 1, wherein the contact strips (5) are secured to a supporting frame (17).

8. The device according to claim 7, wherein the size of the supporting frame (17) is substantially the same as the size of the work piece (1).

9. The device according to claim 8, wherein the shape of the supporting frame (17) is substantially the same as the shape of the work piece (1).

10. The device according to claim 7, wherein the work piece (1) is board-shaped and rectangular and the supporting frames (17) each have four contact strips (5) that are oriented substantially parallel to the side edges of the work piece (1).

11. The device according to claim 7, wherein at least two supporting frames (17) are provided for retaining a board-shaped work piece (1), each of them being associated with a respective side of the work piece (1).

12. The device according to claim 7, wherein the supporting frames (17) are capable of holding the work piece (1) either directly or through the contact strips (5).

13. The device according to claim 7, wherein the supporting frames (17) are supported on supporting points (21) through supporting elements (6,22, 23,27) in a tank (4) serving to hold processing fluid.

14. The device according to claim 13, wherein the supporting elements (6,22, 23,27) are configured to be movable so that the positions of the supporting frames (17) relative to the supporting points (21) in the tank (4) may be varied.

15. The device according to claim 13, wherein the supporting elements (6,22, 23,27) are configured in such a manner that a board-shaped work piece (1) that is fed between two supporting frames (17) and/or contacting frames each associated to a respective side of the work piece (1) can be clampingly held there between.

16. The device according to claim 7, wherein frame covers (20) are mounted to the supporting frames (17) and/or contacting frames in such a manner that the covers (20) and the work piece (1) form closed compartments.

17. The device according to claim 16, wherein the covers (20) are fluid-tight or almost fluid-tight or wherein they are ion-permeable.

18. The device according to claim 16, wherein the covers (20) are shaped in such a manner that the counter electrodes (16) are disposed within the closed compartments.

19. The device according to claim 16, wherein feed tubes (25) for feeding the processing fluid to the closed compartments and drain tubes (25) for evacuating said fluid from said closed compartments are provided in the covers (20) and/or in the supporting frames (17).

20. The device according to claim 7, wherein the supporting frames (17), the contact strips (5) and counter electrodes (16) contained in the device are movable together as one combined unit in such a manner that, during electrolytic treatment, the work piece (1) is held by this unit while the contact strips (5) can be brought into electrical contact with the work piece (1) and that after electrolytic treatment the work piece (1) can be released from said unit and the electric contact be disconnected again.

21. The device according to claim 1, wherein measuring probes are mounted opposite the surfaces of the work piece (1).

22. The device according to claim 1, wherein the device is part of a conveyorized plating line or of a dip plant for treating a work piece (1) being an electrical printed circuit board.

23. The device according to claim 22, wherein the device comprised in the conveyorized plating line further comprises treatment tanks (4) that are each equipped with entry and exit regions as well as conveying devices (29) for the printed circuit boards (1) and current sources for the current supply devices (5).

24. The device of claim 1, wherein the treatment tank (4) is a vertical dip tank.

25. A device for electrolytically treating an at least superficially electrically conducting work piece having substantially opposing side edges, said device comprising current supply devices for the work piece, said current supply devices each comprising contact strips for electrically contacting the work piece at the substantially opposing side edges;
said contact strips being arranged in the treatment tank so as to receive the work piece in the treatment tank, so as to hold the work piece in the treatment tank and so as to be permanently stationed in the treatment tank; wherein the permanently stationed contact strips are displaceable within said treatment tank.

26. The device according to claim 25, wherein the device comprises counter electrodes (16) that are disposed opposite the work piece (1).

27. The device according to claim 26, wherein the counter electrodes (16) are mounted to the supporting frames (17).

28. The device according to claim 26, wherein the counter electrodes (16) are movable parallel to the surface of the work piece (1).

29. The device according to claim 26, wherein the counter electrodes (16) are disposed substantially parallel to the work piece (1) and are movably carried on the supporting frames (17).

30. The device according to claim 26, wherein the size of the counter electrodes (16) approximately corresponds to the useful area on the work piece (1) that is to be electrolytically treated.

31. The device according to claim 25, wherein the contact strips (5) are secured to a supporting frame (17).

* * * * *